United States Patent
Cudich et al.

(10) Patent No.: US 8,819,542 B2
(45) Date of Patent: *Aug. 26, 2014

(54) ENTERPRISE WEB APPLICATION CONSTRUCTOR SYSTEM AND METHOD

(75) Inventors: Matias Cudich, San Francisco, CA (US); Stephan Dennis Morais, San Francisco, CA (US)

(73) Assignee: Oracle International Corporation, Redwood Shores, CA (US)

( * ) Notice: Subject to any disclaimer, the term of this patent is extended or adjusted under 35 U.S.C. 154(b) by 846 days.

This patent is subject to a terminal disclaimer.

(21) Appl. No.: 12/108,190

(22) Filed: Apr. 23, 2008
(Under 37 CFR 1.47)

(65) Prior Publication Data
US 2009/0013244 A1     Jan. 8, 2009

Related U.S. Application Data

(60) Provisional application No. 60/914,623, filed on Apr. 27, 2007.

(51) Int. Cl.
*G06F 17/00* (2006.01)

(52) U.S. Cl.
USPC ........... 715/243; 715/246; 715/764; 715/765; 715/289; 715/207; 715/204; 715/231; 715/747; 715/802; 709/203

(58) Field of Classification Search
USPC ......... 715/202, 762–763, 243, 246, 764, 765; 715/289, 207, 204, 231, 747, 802; 707/607; 709/203
See application file for complete search history.

(56) References Cited

U.S. PATENT DOCUMENTS

| | | | |
|---|---|---|---|
| 5,088,052 A | 2/1992 | Spielman et al. | |
| 5,873,106 A | 2/1999 | Joseph | |
| 5,983,227 A | 11/1999 | Nazem et al. | |
| 6,026,433 A | 2/2000 | D'Arlach et al. | |
| 6,263,328 B1 | 7/2001 | Coden et al. | |
| 7,543,267 B2 | 6/2009 | Lindhorst et al. | |
| 7,555,713 B2* | 6/2009 | Yang | 715/248 |
| 7,716,634 B2 | 5/2010 | Ross et al. | |
| 2004/0006710 A1 | 1/2004 | Pollutro et al. | |
| 2004/0054967 A1 | 3/2004 | Brandenberger | |
| 2004/0073565 A1 | 4/2004 | Kaufman et al. | |
| 2004/0148307 A1* | 7/2004 | Rempell | 707/102 |
| 2004/0189703 A1 | 9/2004 | Zhang et al. | |
| 2005/0138614 A1 | 6/2005 | Nelson et al. | |
| 2006/0004703 A1 | 1/2006 | Spivack et al. | |

(Continued)

OTHER PUBLICATIONS

Bergland et al., ("Lotus Workplace Web Content Management" Published Jul. 2004 by IBM.Com/Redbooks total 50 pages.*

(Continued)

*Primary Examiner* — Quoc A Tran
(74) *Attorney, Agent, or Firm* — Kilpatrick Townsend & Stockton LLP

(57) ABSTRACT

A web-based application constructor can be used to construct a web display. The web-based application constructor can obtain data from heterogeneous data sources having Web Services schemas to produce the web display. The web display can contain page components and can display the data from at least some heterogeneous data sources. A versioning system can keep track of changes to page components, page layout, searches, and text to allow users to make changes without administrative approval.

34 Claims, 11 Drawing Sheets

(56) References Cited

U.S. PATENT DOCUMENTS

| | | | |
|---|---|---|---|
| 2006/0041589 A1 | | 2/2006 | Helfman et al. |
| 2006/0200748 A1 | * | 9/2006 | Shenfield .................. 715/501.1 |
| 2006/0259462 A1 | * | 11/2006 | Timmons ........................ 707/3 |
| 2006/0294496 A1 | | 12/2006 | Smith et al. |
| 2007/0055926 A1 | | 3/2007 | Christiansen et al. |
| 2007/0061296 A1 | | 3/2007 | Burke et al. |
| 2007/0106647 A1 | * | 5/2007 | Schwalb .......................... 707/3 |
| 2007/0118844 A1 | * | 5/2007 | Huang et al. .................. 719/330 |
| 2007/0168380 A1 | | 7/2007 | Chitrapura et al. |
| 2008/0010387 A1 | | 1/2008 | Curtis et al. |
| 2008/0071929 A1 | * | 3/2008 | Motte et al. .................. 709/246 |
| 2008/0140766 A1 | | 6/2008 | Mohan |
| 2008/0172372 A1 | | 7/2008 | Shacham et al. |
| 2009/0006360 A1 | | 1/2009 | Liao et al. |
| 2009/0013245 A1 | | 1/2009 | Cudich et al. |
| 2009/0013246 A1 | | 1/2009 | Cudich et al. |
| 2009/0013267 A1 | | 1/2009 | Cudich et al. |
| 2009/0019357 A1 | | 1/2009 | Cudich et al. |
| 2009/0019522 A1 | | 1/2009 | Cudich et al. |
| 2009/0024915 A1 | | 1/2009 | Cudich et al. |
| 2009/0024939 A1 | | 1/2009 | Cudich et al. |
| 2009/0031401 A1 | | 1/2009 | Cudich et al. |
| 2009/0063953 A1 | | 3/2009 | Kraus et al. |
| 2009/0138792 A1 | | 5/2009 | Cudich et al. |

OTHER PUBLICATIONS

Srinivas et al. "Coupling RDF/RSS, WSRP and AJAX for Dynamic Reusable Porlets: AN Approach and a Use Case" Published Jul. 9-Jul. 13, 1007 by CS Digital Library, pp. 3.*

Bergland et al., ("Lotus Workplace Web Content Management" Published Jul. 2004 by IBM.Com/Redbooks total 616 pages.*

Siegfried et al., "Authoring and Annotation of Web Pages in CREAM" pp. 462-473 by ACM-Published May 7-11, 2002, USA.*

Final Office Action for U.S. Appl. No. 12/109,133 mailed on Aug. 16, 2012, 10 pages.

Office Action for U.S. Appl. No. 12/109,133 mailed Feb. 13, 2013.

U.S. Appl. No. 12/109,133, Final Office Action mailed on Jul. 31, 2013, 13 pages.

U.S. Appl. No. 12/109,133, Non-final office action mailed on Nov. 22, 2013, 14 pages.

Yourdon, "Java, the Web, and Software Development", Aug. 1996, Computer, IEEE Computer Society, vol. 29, No. 8, pp. 25-30.

Nguyen et al., "Finegrained, Structured Configuration Management for Web Projects", Thirteenth International World Wide Web Conference Proceedings 2004, Association for Computing Machinery, Dec. 1, 2004, 10 pages.

"ArticleLive 2005: End User Guide", Interspire, 2005, 38 pages.

Rockley, "Managing Enterprise Content: A Unified Content Strategy", New Riders, Oct. 17, 2002. 23 pages.

Non-Final Office Action for U.S. Appl. No. 12/108,402, mailed on Apr. 1, 2011, 11 pages.

Non-Final Office Action for U.S. Appl. No. 12/108,411, mailed on Dec. 22, 2010, 22 pages.

Non-Final Office Action for U.S. Appl. No. 12/108,390, mailed on Jun. 20, 2011, 17 pages.

Non-Final Office Action for U.S. Appl. No. 12/108,372, mailed on Jan. 31, 2011, 34 pages.

Non-Final Office Action for U.S. Appl. No. 12/108,352, mailed on Jan. 27, 2011, 44 pages.

Non-Final Office Action for U.S. Appl. No. 12/108,314, mailed Dec. 16, 2010, 23 pages.

Non-Final Office Action for U.S. Appl. No. 12/108,301, mailed on Jan. 27, 2011, 38 pages.

Non-Final Office Action for U.S. Appl. No. 12/108,280, mailed Jan. 25, 2011, 32 pages.

Final Office Action for U.S. Appl. No. 12/108,390 mailed Jan. 12, 2012, 13 pages.

Non-Final Office Action for U.S. Appl. No. 12/109,133 mailed Jan. 6, 2012, 7 pages.

U.S. Appl. No. 12/109,133, Final Office Action mailed on May 12, 2014, 17 pages.

* cited by examiner

ENTERPRISE WEB APPLICATION CONSTRUCTOR SYSTEM AND METHOD

CLAIM OF PRIORITY

This application claims priority to U.S. Provisional Application No. 60/914,623 entitled "ENTERPRISE WEB APPLICATION CONSTRUCTOR SYSTEM AND METHOD", filed Apr. 27, 2007, by Matias Cudich et al., which is herein incorporated by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

Embodiments of the present invention relate to a seamless, collaborative environment for creating applications, consuming information, and contributing content.

DETAILED DESCRIPTION

Figure 1:
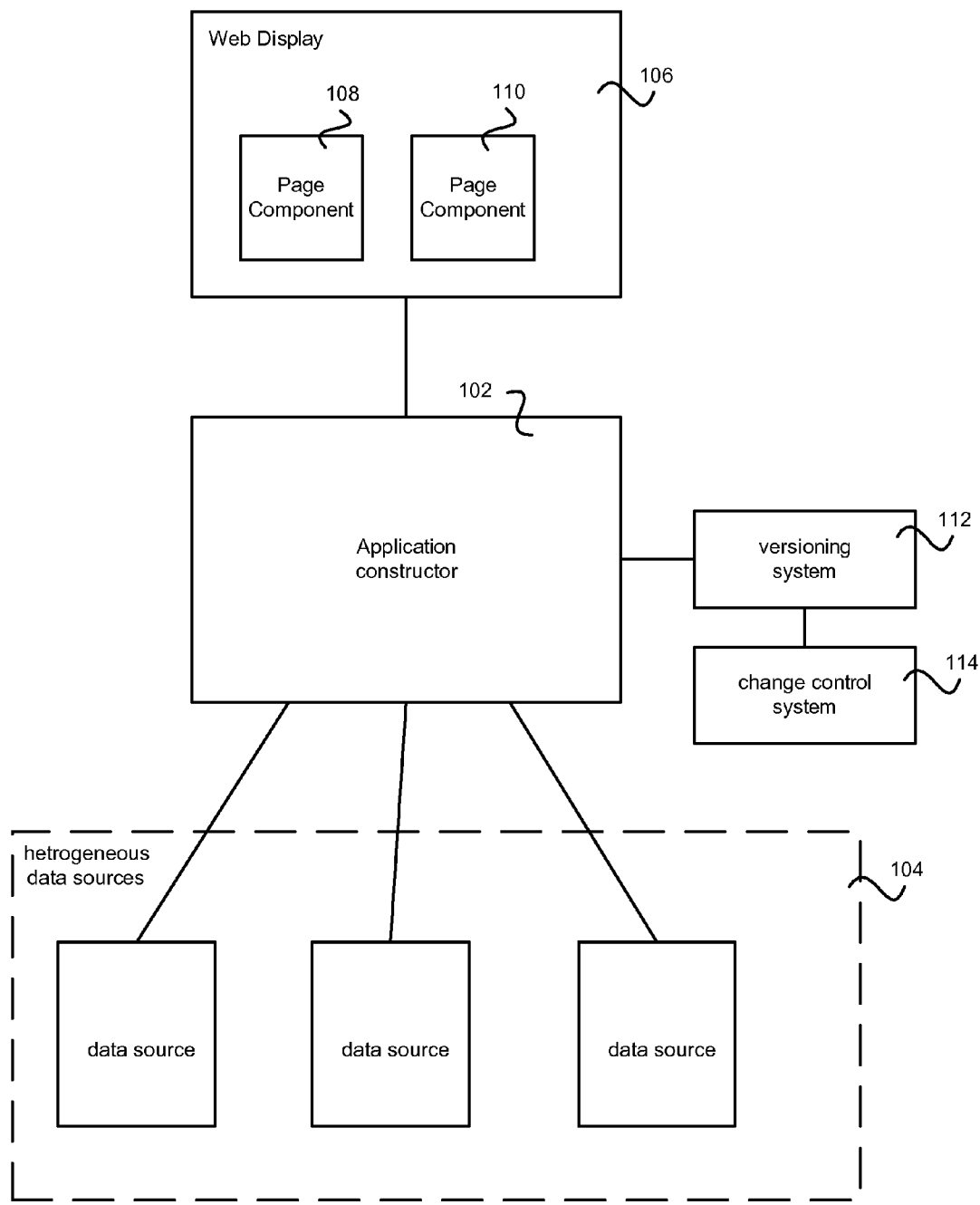
FIG. 1 shows an overview of a constructor system of one embodiment.

Embodiments of the present invention enable users to manage information stored in both native databases and external systems. In concert with the rich set of page components, data sources can let users create on-the-fly applications that surface critical business information such as sales leads from a Siebel CRM system, or manage lightweight data sets, such as a product feature list.

One embodiment of the present invention is a web-based application constructor 102 for constructing a web display. The web-based application constructor 102 can obtain data from heterogeneous data sources 104 to produce the web display. The web display 106 can contain page components 108 and 110 and display the data from at least some of the heterogeneous data sources 104.

A versioning system 112 can keep track of changes to page components to allow users to make changes without administrative approval. The versioning system 112 can keep track of changes to page layout, searches, and text to allow users to make changes without administrative approval. A change control system 114 can allow users to dynamically undo changes to page components while using the web-based application constructor.

The versioning system 112 can store old versions of the web display and thus allow the users to roll back changes. For example, the system can store a history of old versions and when a user makes an error, the page can be rolled back to a previous version.

The page components can be elements constructed from data in the heterogeneous data sources. For example, the page components can expose data from ERP, Database or other sources.

The heterogeneous data source can be resources with a company. The heterogeneous data source can include relational database management system, a customer relationship management system; enterprise resource planning system and/or any other types of data sources.

The heterogeneous data sources can have Web Services schemas that allow the application constructor to produce a display of the data. The page components can contain interactive elements. In one embodiment, all page editing is versioned.

Whether a page component is displayed to a user can be controlled by roles and security. For example, some pages can have page components that are only viewable by users in a certain group or with a certain security level. Display and/or updates to page components can be controlled by using the URLs for the page components. The web-based application constructor can provide roles to users that can be used to limit access to applications.

The page layout can also be versioned. Versions of the page can stored at a remote server. AJAX at a user browser can send version update information to the remote server. Page templates can be used to create the display. The page components can include rich text.

The page components can have their own URL so that they can be shared among applications. For example, a user can copy a page component into their own page since the system can use the page components URL to copy it into a new display page. In this way, updates can be sent to multiple pages.

The page components can include a view of data in a list, a view of data in a record, a view of an ad-hoc application or other views. The display can be constructed from available applications, where available applications can be dragged and dropped into page components.

In one embodiment, at least one of the heterogeneous data sources is a searchable resource. When the display provides for a search field into the searchable resource, the result of a search can be shown in a page component of the display. The page components can be dragged and dropped to a new display. In one embodiment, the changes to the page component are not propagated back to the application data source propagated back to the application.

The web-based application constructor can provide roles to users that can be used to limit access to applications. The application constructor can convert at least one object from a heterogeneous data source into a page component. The system can allow for the construction of user interfaces to access different types of data.

Change control system 114 can allow users to dynamically undo changes to page components while using the web-based application constructor.

All page editing can be versioned. The change control system can allow for a redo of changes. The versions can be time stamped and changes can be rolled back up. For example in one embodiment, users can rollback changes to a state as of a previous period of time. Changes can be dynamically made to page components, page layout, searches, and text while using the web-based application constructor.

In one embodiment, the web-based application constructor can allow users to annotate page components with comments visible in the web display.

In one embodiment, the page components can be identified by URLs and the annotations can be associated with the URL. In one embodiment, the annotations can receive user inputs from multiple pages and produce a common display. A web-based text editor can be used for the annotations.

Figure 7:
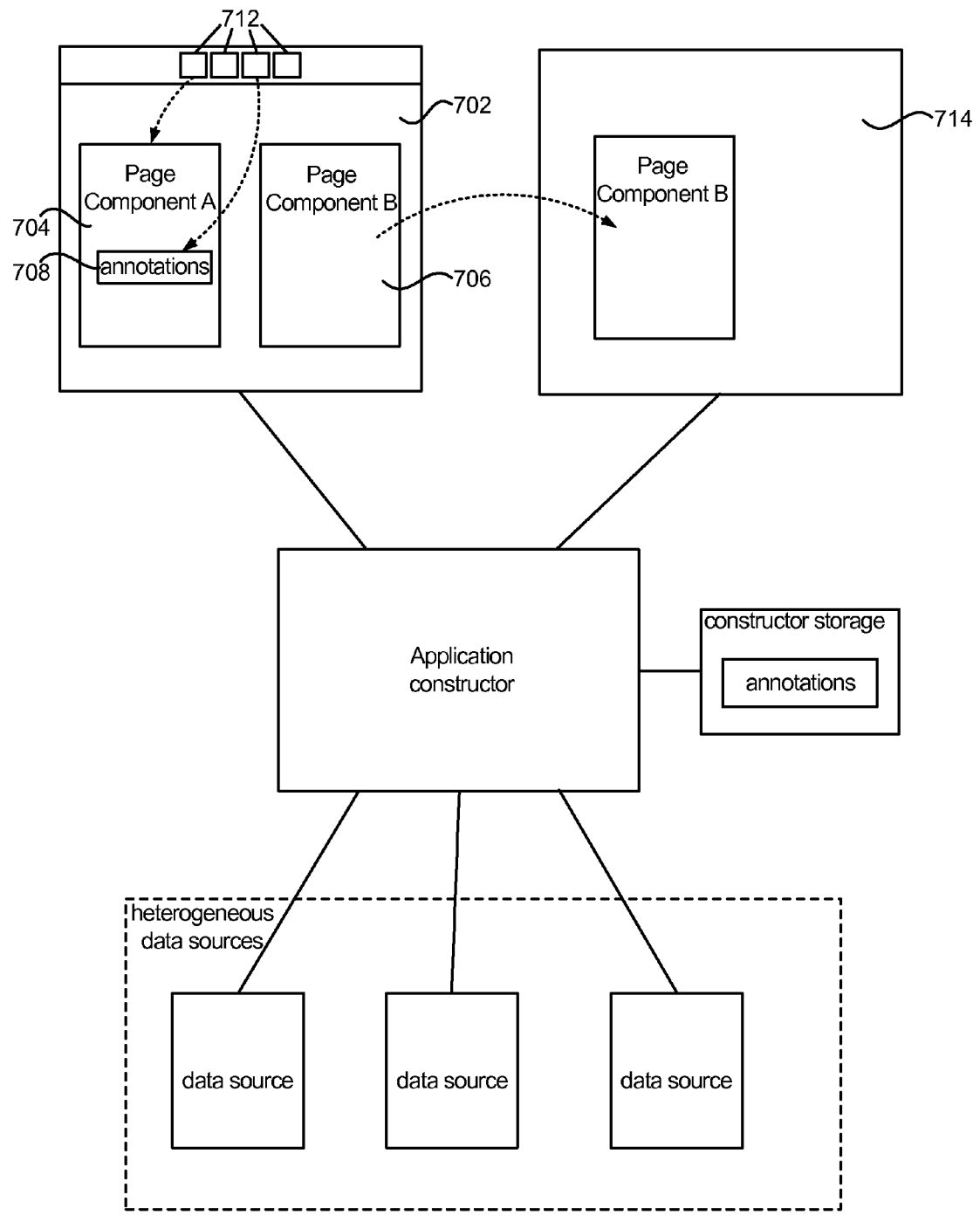
FIG. 7 illustrates a system using annotations.

FIG. 7 shows an example with a page 702 having page components 704 and 706. Annotation 708 can be created to be associated with the page component 704. Drag and drop selections 712 can be used to drag and drop page commands and annotation boxes onto page 702. Page Component B can also be dragged and dropped from page 702 into page 714.

One embodiment of the present invention includes an application constructor to convert at least one object from a heterogeneous data source into a page component.

In one embodiment, the system allows for the construction of user interfaces to access different types of data. Web service WSDL can be analyzed to determine user interface fields. An XML editor framework can analyze XML schema at the WSDL.

The page components are accessible by URLs. URLs can be used by a security system. The Roles can be used to determine what page components are displayable to as user.

The URLs can be automatically created. All elements on a page can have its own URL.

The page components can contain interactive elements.

An XML editor framework can be adapted to use web services schemas to automatically create a user interfaces for inputting data in fields determined from the web service schemas. Page components can contain data that has been converted into a list format. Clicking on elements of the list can access additional details of the list. The list can be annotated.

The page components can be extensible.

The page display can have a nested layout. The nested layout can include rows and columns in a cell defined by rows and columns. Different rows can have different numbers of columns. The page components can be dragged and dropped so as to change the layout. New columns and/or rows can be created by the dragging and dropping.

The page components can be defined as being positioned left, right, up or down of a previous page layout location. The HTML can be updated at a server as a result of the dragging and dropping.

Different rows can have different numbers of columns.

Figure 8A:
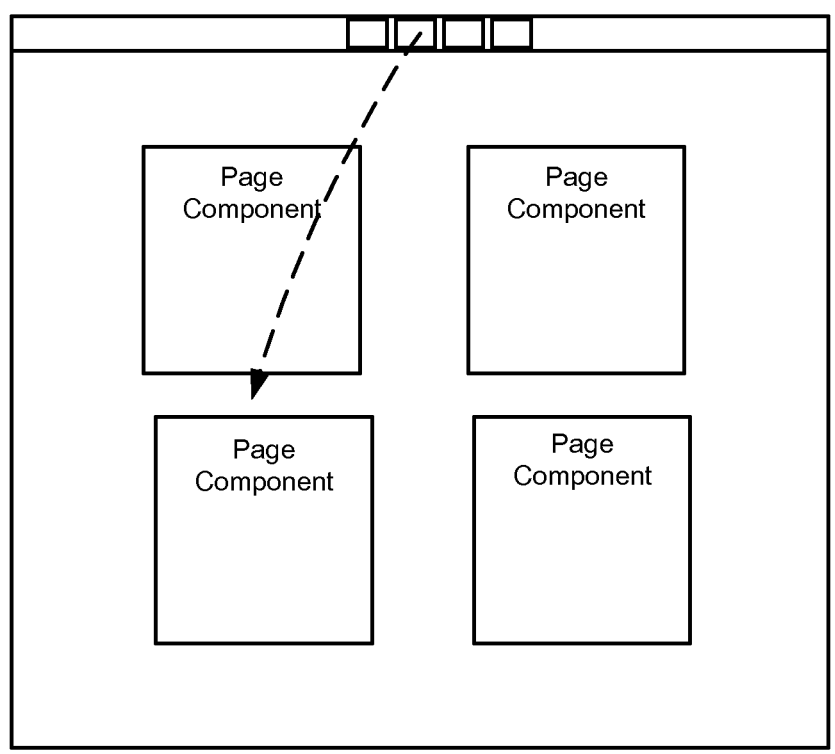
FIG. 8A-8C illustrates the configuration of pages.
Figure 8B:
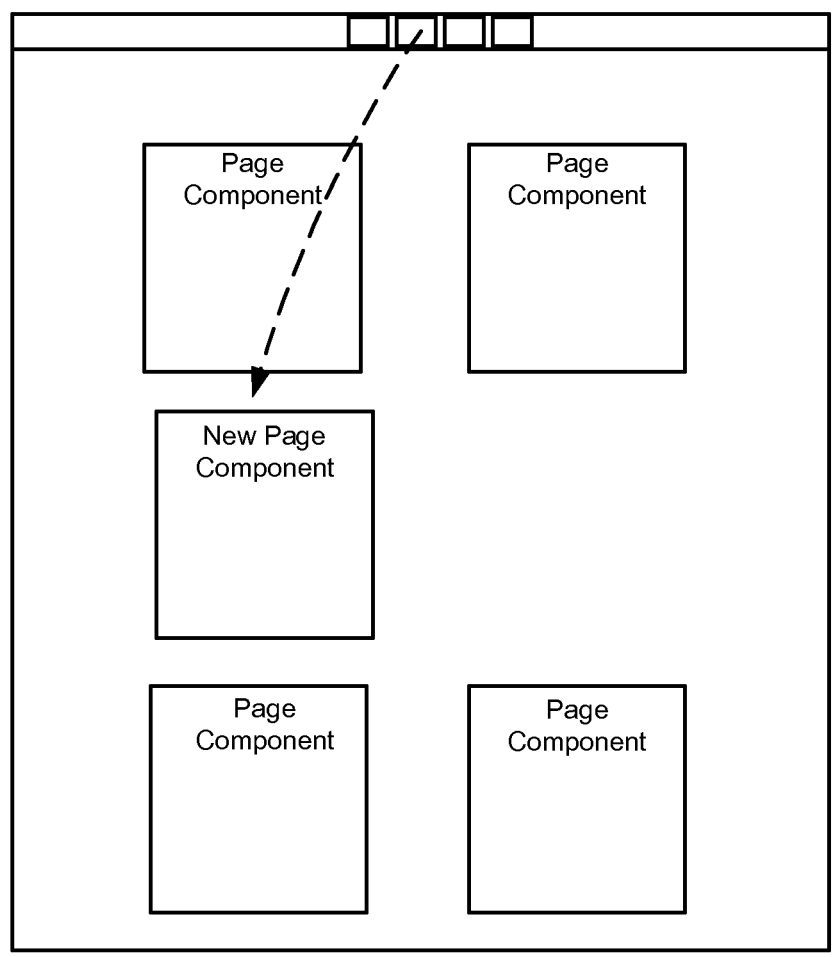

FIGS. 8A and 8B show an example of the dragging and dropping of a page component so that a new row is created.

Figure 8C:
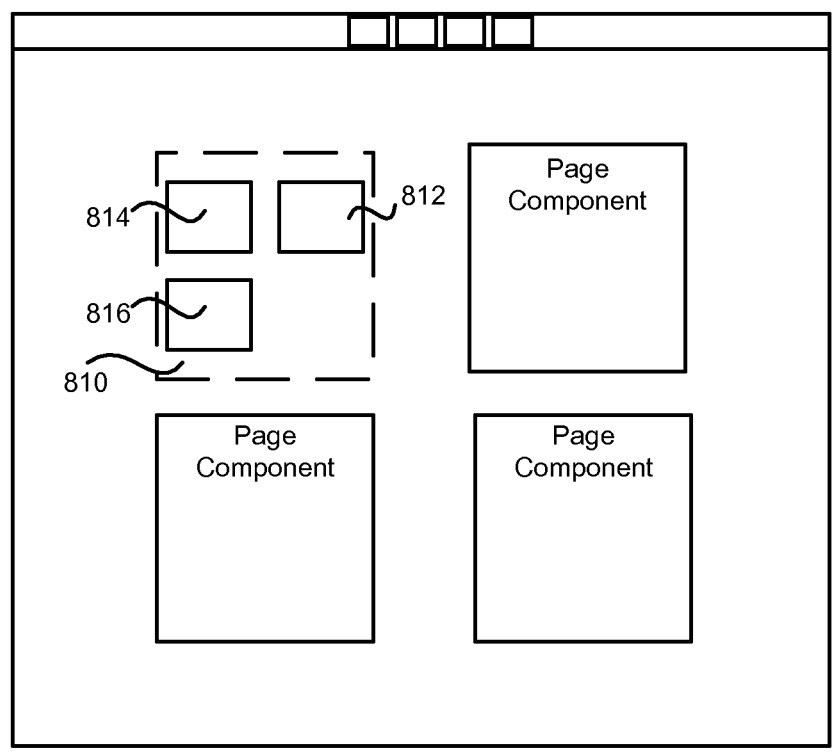

FIG. 8C shows an example where a cell within a row and column location can have rows and columns. The page components 812, 814 and 816 are cells within rows and columns that are within page component 810.

AJAX at a browser can send page layout instruction to a server to create new HTML for a page. The AJAX can update the page at the browser without refresh.

In one embodiment, the application constructor can allow querying of the data sources.

Figure 9:
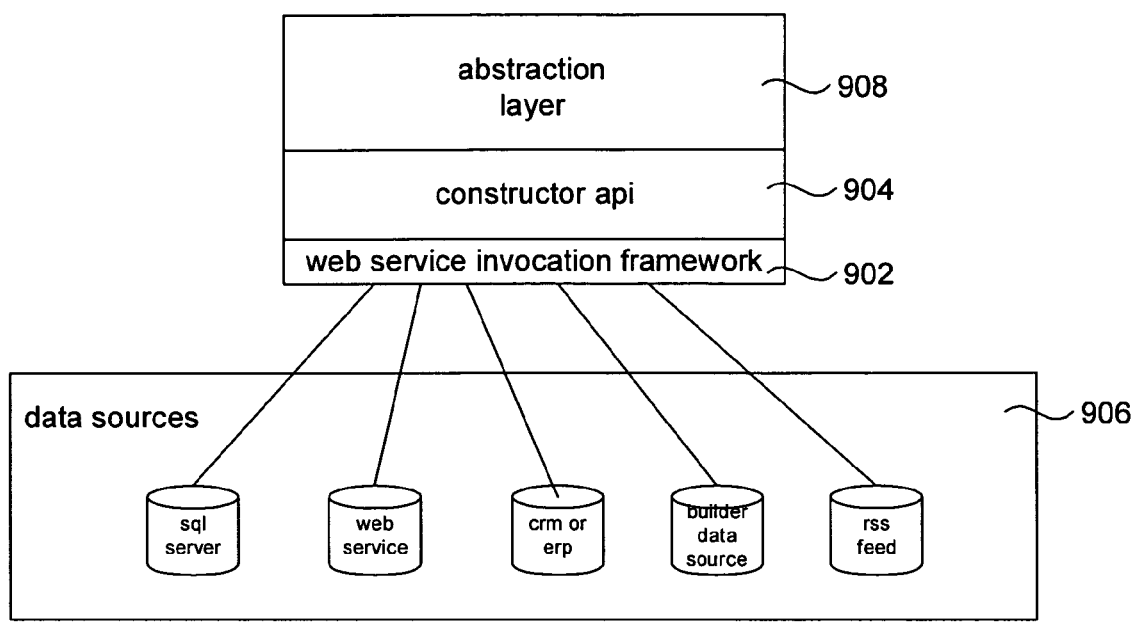
FIG. 9 illustrates an example with a web service invocation framework

FIG. 9 shows an example with a web service instruction framework 902 used to access data sources 906 for a constructor API 904. The data sources 906 can us web schemas that allow for the access by the web services invocation framework 902. Abstraction layer 908 can provide for a UI on top of the constructor API 904.

The Web Services Invocation Framework (WSIF) is a simple Java API for invoking Web services, no matter how or where the services are provided.

WSIF enables developers to interact with abstract representations of Web services through their WSDL descriptions instead of working directly with the Simple Object Access Protocol (SOAP) APIs, which is the usual programming model. With WSIF, developers can work with the same programming model regardless of how the Web service is implemented and accessed.

WSIF allows stubless or completely dynamic invocation of a Web service, based upon examination of the meta-data about the service at runtime. It also allows updated implementations of a binding to be plugged into WSIF at runtime, and it allows the calling service to defer choosing a binding until runtime.

DETAILED DESCRIPTION OF ONE EXEMPLARY EMBODIMENT

The following describes one exemplary but non-limiting example of a system of the present invention.

Page editing can include:
Classic wiki-style page creation and editing
Performed by typical end users as part of using the system
Pages can be designed to evolve over time, by being edited by multiple users over multiple edit sessions (which can be concurrent)
Example pages: product launch workspace, article on customer wiki pages, etc.

State and mode management can be done in multiple ways. In one embodiment, regardless of the shell applied to the given page/live space, users can specify a mode and a state for the page they are viewing or editing. When in Read mode, there is only one state—read. When in Edit or Decorate mode, users can switch between Insert and Write edit states, each of which can have an associated set of controls/UIs. These modes and states can be independent of the shell applied to the page.

The primary toolbar can be the main mode controller for the page, allowing users to switch between Read and Edit modes.

The secondary toolbar can allow users to perform actions associated with each mode. Also, when in Edit or Decorate mode, users can use the secondary toolbar to specify a state for the page.

Read mode can allow users to perform actions that don't alter the actual contents of a given page. For example, when viewing a page in read mode, users can add comments, documents, and create new pages.

In one embodiment, edit mode does allow users to alter the contents of pages, either by inserting, moving, or deleting page components, or by entering or deleting rich text. The actions a user can perform can be governed by the state the page is in.

While in Read mode, users can create new pages. To create a new page, users can specify a page title, a URL for the page (this can be automatically generated by the form, but users can override the URL if they so desire), and a description for the page. Moreover, users can specify a layout for the page, and the Live Space in which the page will live. By default, pages can be placed in the current Live Space; users do have the opportunity, however, to place the page in another Live Space—either one that exists, or a new one they create on the fly.

Once a page is created, users can go back and modify certain settings, and view properties for that page. This uses the same user interface for creating a page. In one embodiment, users can change the following settings/properties once a page is created: title, name, and description, parent Live Space.

In one embodiment, users can add comments to pages while in Read mode.

Users can add documents to pages while in Read mode.

While in the Insert edit state, users can drag-and-drop components on to a given page, delete components that already exist on a given page, move around components that already exist on a given page, and enter into configuration wizards for all components on a given page. When in Insert edit state, the secondary toolbar updates to display a list of component types that the user can add to a given page. Users can also drill into a secondary UI (Chooser) to pick a component type or component instance not listed in the secondary toolbar. Note that the component types listed in the secondary toolbar can be draggable items that can be dragged on to the page. While in Insert edit state, each component on a given page is automatically disabled (e.g., while in Insert edit state, users cannot sort or add rows to a data table).

While in Insert edit state, users can drag and drop components into a page. To drag and drop a component into a page, a user simply mouse's down on one of the component types listed in the Insert edit state secondary toolbar, and then drags that on to the page. Once the drag item is inside a valid insert target (as defined by the current layout), the page can update to display a "shadow marker" of where the component would live if it where dropped into the page. Users can place components into empty insert targets, or into insert targets which already contain other components. When placing a component into an empty insert target, it's fairly straightforward—the page shows a shadow marker inside the empty insert target (the shadow marker should fill up the entire insert target) and when the user drops the item, the page refreshed to display the new component. When adding a component next to an existing component (inside a non-empty insert target), users can decide to place the new component to the left, right, top or bottom of the existing component. If placing the new component to the left or right of an existing component, the existing component and other components on the same "row" can condense to make room for the new component. If placing a component above or below an existing a component, a new "row" can be created to accommodate the new component.

Upon adding a new component to a page, or when clicking the Settings/Properties button on a component's toolbar while in Insert mode, the application can pop up a Settings wizard, which lets a user configure settings for a given component. Each component type has its own wizard, which each instance of that type uses to let users specify settings such as Title, Description, Dataset, and so on.

While in Write edit state, users can add rich text to a given page. In one example, there are three possible workflows that lead to this: (a) a user drags and drops a Text page component on to a page, at which point the page switches from Insert to Write edit state, or (b) a user clicks the Write edit state button on a page with no existing rich text components at which point a default text component is added for the user by the application, or (c) a user clicks the Write edit state button on a page that already has one or more text components on it, at which point each of those components becomes editable. While in Write edit state, each component on a given page is still enabled, and usable (e.g., a user can write and add a new row to a data table while in Write edit state).

While in Write edit state, users can add new rich text to a page, and modify existing rich text. To apply formatting to rich text, a user follows similar steps to formatting rich text: highlight text, apply formatting, etc. Users are also able to paste in rich text from other sources (e.g., Word, Web, etc.) and have the rich text formatting maintained to some degree.

As noted above, users can specify a layout for a page when creating a page. For example, a user can decide that a page should have a two-column layout, a header-body-footer layout, and so on. The purpose of layouts is to allow users to arrange page components in ways that suit their needs. Layouts can be comprised of "insert targets" or containers arranged in a particular way. At their core, layouts can be just XHTML templates, with some CSS to specify how that XHTML is rendered on the page. When in Insert edit state, layouts constrain where on a page components can be placed. In some cases, a layout may contain areas into which components can't be placed. In one embodiment, a page's chosen layout can't be changed once the page is created. Layouts can be stored and edited on the file system in the /webtier/layouts directory.

Upon making changes to a page—either by adding, removing or moving a component, or by adding or modifying rich text—a user can decide to save the page as a draft or to publish the page. When saving a page as a draft, users are specifying that only they, and no other user, should see their changes to the page. Only until a user publishes their changes can other users see those changes. A page will only let users save or publish a page when an actual change has been made by the user. By default, when a change is made in Insert edit state, the page is automatically saved as a draft; when a change is made in Write edit state, the page is automatically saved as a draft, but on a timed interval. To be clear, users can save a page as a draft, close their browser, come back two weeks later, and they will still have their changes saved to the system, but not yet published.

During a given edit session, users can undo, redo and cancel their changes. While in Insert edit state, users can undo/redo adding a new component, removing a component, moving components, and changing component settings. While in Write edit state, users can undo/redo modifying rich text. If a user wants to discard changes in a given edit session, they can simply hit Cancel. The undo stack is currently limited to ten items by default, but will be configurable.

Users can view past versions for a given page, which is a list of all published edits to a given page. Users can do a number of things for a given version: (a) they can navigate to a given version to see how the page looked at a certain point in time, (b) they can delete a given version, and (c) they can revert to a given version. When navigating to a given version, the page can only be in Read mode. When deleting a given version, the version list updates, but none of the version numbers change. When reverting to a given version, the existing version isn't removed, but the page's "current version" is changed. If a user makes an edit to a current version that's earlier than some other version, the new published version is simply added to the end of the version list.

Figure 2:
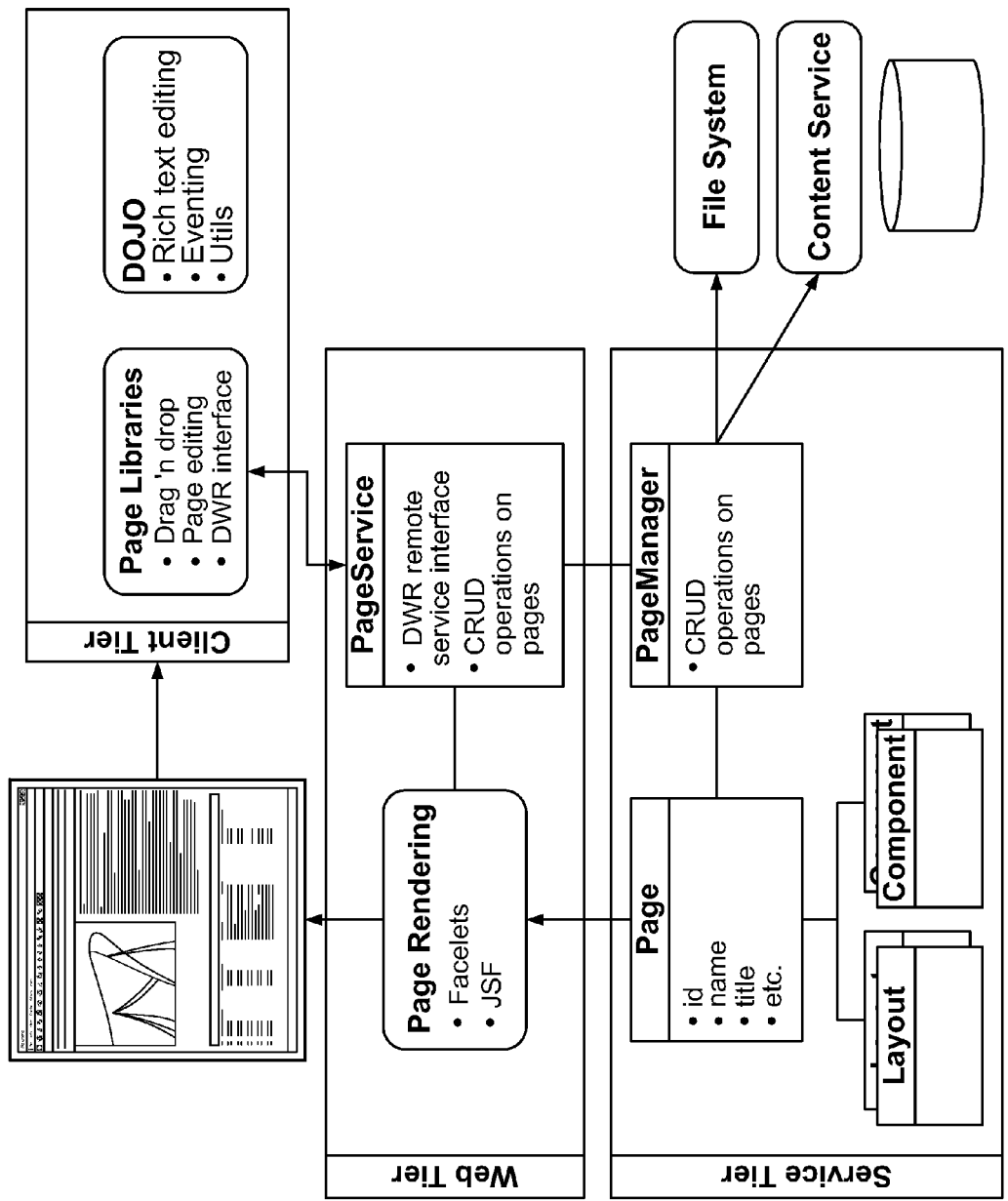
FIG. 2 shows an overview of an architecture of one embodiment.

FIG. 2 illustrates an example of one architecture of a system of the present invention.

Examples of page objects can include
id
name
title
description
children
   components
      e.g., image
layout
   static XHTML, CSS
   insert targets Glue code can be used to transform Constructor-specific page tree into XHTML understood by JSF/Facelets, which then simply turns that all into HTML.

Figure 3:
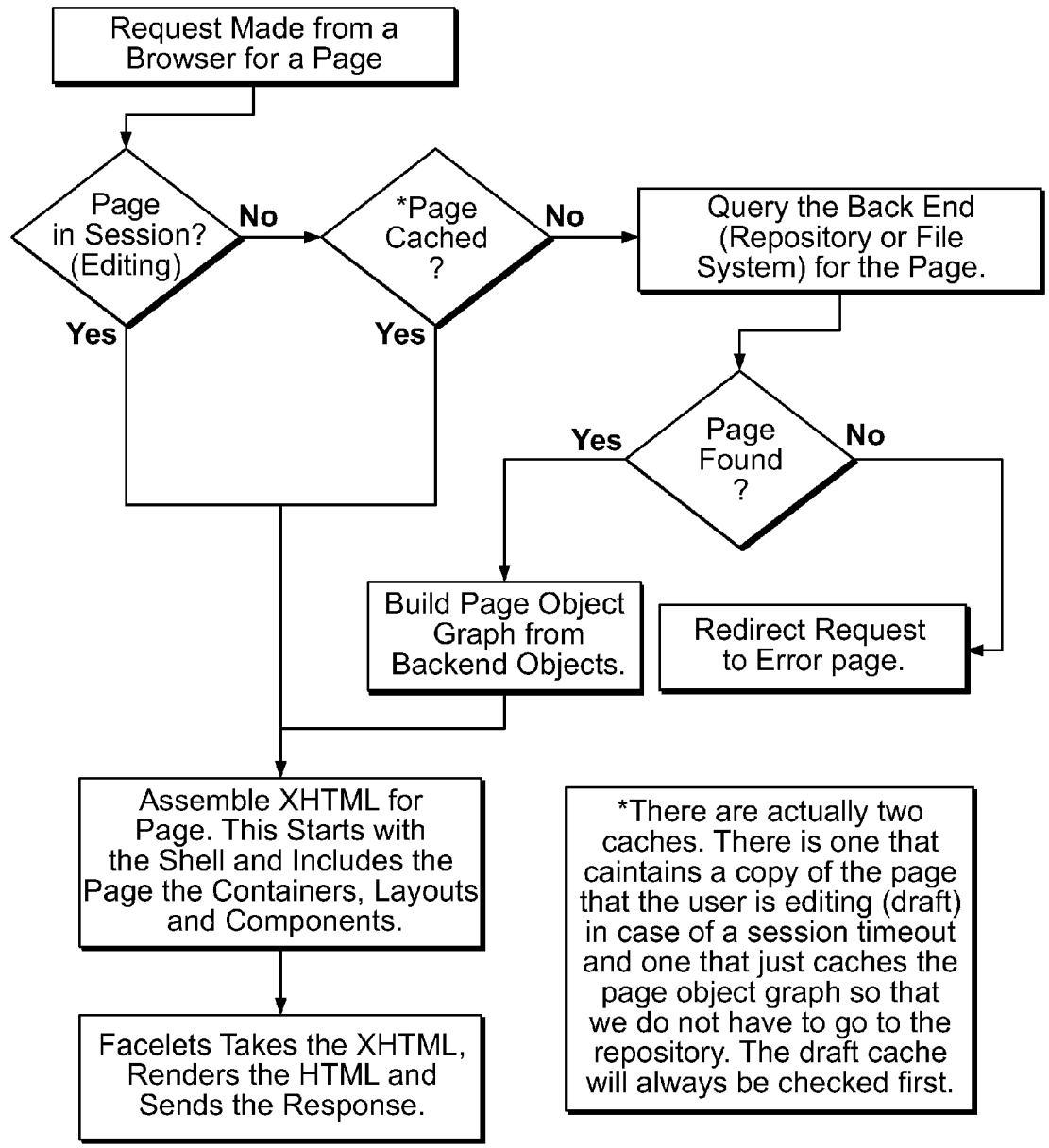
FIG. 3 illustrates a page constructor flow chart.

FIG. 3 shows a flow chart for constructing pages in one embodiment.

When entering Edit mode, JavaScript (via CSS) can highlight the areas of the page into which users can place components. In one embodiment, these insert targets are always there, but only ever get enabled (by JavaScript) when the user enters the appropriate edit state. Going into Edit mode need not make any server requests (with the caveat of checking out the page).

Direct Web Remoting (DWR) can let you call operations/methods on the server via JavaScript. DWR PageService is an abstraction of the server-side PageManager interface. The PageManager allows performing create/read/update/delete operations on/for a given page.

Example call:

```
dwr.PageService.insertNewComponent(component) - JavaScript -> DWR
Ajax call to server - JavaScript/Java Servlet ->
PageService.insertNewComponent(component) - Java -> DWR
Response - HTTP -> page.updatePageWithNewHTML - JavaScript.
```

Dojo can be used for all JavaScript operations on the client, primarily gathering DOM objects, updating styles on those objects, updating page modes and edit states, parts of drag-and-drop, rich-text editing, console logging, and so on.

The Image Component can allow users to embed images into Constructor pages. For example, one could imagine going to a page that lists out recent customer bugs. One might want to display in this page a screenshot of a recent bug file by a customer. By using the image component, users can embed this type of information alongside other components, such as rich text, data tables and so on. Users can also, in the context of a rich-text editing session, embed an image in the middle of some text. This is supported and managed by the rich text editor, but uses the same editor UI as the image component.

Upon dropping the image component on to a page, users can specify a source URL for the image. This can be any URL that is accessible by browsing users (meaning that the server doesn't copy the URL source or proxy the request to the image). So, if the URL is down, the image will also be down. In one embodiment, users must specify fully qualified URLs or URLs relative to the Constructor root context path.

Users can also upload images to the system, if for example, they have the image sitting on their desktop and they want to share it via a Constructor page. To upload an image, users must find the image on their desktop, and then hit Upload. After the image is uploaded, the user can then hit Finish or Cancel. If they hit Finish, the image is then attached as a file to the page, and displayed as an image via the image component. Since these images are attached as files to pages, all document management functionality is available, meaning that these images can be versioned, etc. Images can also be deleted ex post facto, and if so, the image component can display a friendly message stating that the image it's pointing at has been deleted.

Users can also point at an image which is already attached to the given page. Here, upon picking an image from this list, the editor displays a preview of the image. If a user swaps the image, the old image is not deleted.

Whenever a user points at a URL, uploads an image, or chooses an image already attached to the page, the editor is designed to give a preview image. This preview can be a scaled-down version of the original image. The scaled down version can maintain the original aspect ratio of the image, and doesn't exceed a specified maximum height or width.

The image component can support all file types supported by the browsers in our support matrix.

When specifying an image, the editor automatically grabs the width and height attributes for that image, and sets those for the image component. This allows the page to automatically distribute components to the left and right of an image component, so that the contents of the image component are not cut off. We will provide a suggestion to users that they shouldn't add to pages images greater than a certain width, such as 1024px wide (minimum browser width). Users can override the automatically specified height and width values generated by the editor.

The Image Component can automatically resize images to fir the column they're in. If an image is smaller than the column it's in, its size doesn't change. If the image is too wide, then it can be scaled appropriately to fit. Images need not automatically resize when the window size changes; they do, when the sidebar is toggled on and off in the default shell.

The image component can automatically add the image title text as alternative text on the IMG tag inside the image component.

The image component editor can be based on the XML Editor Framework. This supports all of our wizard rendering, help text, and all of the form fields that show up (including their validation).

Images can be stored in the content repository as attachments to pages (just like other documents).

Image titles and descriptions can be indexed by the search engine.

Images attached to pages can be fetched via the Constructor document download servlet. To get a given document, you pass in a document ID and version number (optional).

Image properties are checked asynchronously (this is used when either pointing at a URL or uploading a new image).

While users can add free-form content to pages using rich text and components, they also may want to add to pages unstructured content living inside of Word documents, PowerPoint presentations and so on. Here, Constructor allows users to attach to pages any kind of document, and perform basic document-management operations on these documents, such as upload, download, and version, revert, and delete.

Users can upload one or more documents using the Add Document wizard in a given page. There is no hard limit on the number of documents that a user can upload simultaneously. Once a document is specified for upload, users can revert that decision by clicking the red button next to the file upload control. Users can browse to any location their browser knows how to get to (file path, UNC path, etc.). When a user hits Upload on this wizard, every one of the files chosen is uploaded, and the progress is displayed via a progress bar. If an error is encountered during upload (exceeded maximum upload size, timeout, etc.), the error will be displayed in the wizard, and the user will get another chance to change their list of upload files, and try to upload them again. Once these files are attached/uploaded, they will appear in the Info panel.

When a document is attached/uploaded, the system can store metadata about that document: name, file size, the name of the user who uploaded the file/version, version number, date stamp, content type, and text preview (first 100 characters). All of this metadata is then available via the Info panel and Document as Page UI. None of this metadata is directly user-editable.

Users can download a given document from a variety of locations: Info panel, Document as Page UI, link inside of a rich-text area. All downloads are passed through the Constructor download servlet.

If a user has already uploaded a given document, and then makes some changes to that document, and wants to update the version attached to the page, they simply have to go to the page, click Add Documents, and then point at the new version sitting on their desktop. Because both of these versions share the same name, Constructor can know that the user intends to increment the version of the document already attached to the page. It is important to note that this comparison is done only against the name of the latest version.

Every document attached to a page has its own page/URL. When you navigate to the document (via the Info panel, Organizer, etc.) you can perform the following operations: upload a new version of the document, delete a version of the document, delete all versions of the document, revert to a version of the document, and decorate the document. Decorating a given document-page is identical to decorating a record-page or recordlist-page. Like these other objects, only one page exists for any given document.

If a user wants to create a new version of a specific document, users can navigate to the document (document as page), and click Upload New Version. This allows users to upload a new version of the given document that perhaps has a different file name. Once this happens, the operative file name of the document changes to the file name of the latest uploaded document. This is important when it comes to figuring out whether or not to increment a given document, or create a new attachment when a user tries to do a simple file version task. The system need not be designed to look at old versions of a given document when figuring out whether or not to increment a document's version history.

Users can revert to any version of a given document. This can be a version uploaded before or after the version labeled as "current". For example, a user can upload five versions of a document, and then decide to revert to version 3. At this point, all five versions still exist, but version 3 is the "current" version. Then, a user can choose to revert to an even earlier version, or back to the latest version. If a user reverts to a previous version, then uploads a new version, the version list is incremented by 1 (meaning the new version would be version 6 and versions 4 and 5 would remain). When figuring out whether or not to increment a document, Constructor looks at the "current" version, not the latest version.

Users can delete any version of a document. Once this version is deleted, it cannot be recovered. There is no way to delete the "current" version.

Users can completely delete a document (which implies deleting all versions of a document). The document-page representing this document will be deleted along with the document. Also, links to the document will no longer work.

Objects as Pages can be used to represent structured data, such as records, lists of records, documents, and so on, as pages to which unstructured content can be added. For example, Constructor allows displaying a record such as a Customer Bug as a page; users can then view this customer bug as a page, mark up the page with additional content (using page components and rich text), and comment on the page using Annotations. Because Objects as Pages are based on the Constructor page framework, normal page actions, such as document attachment and page versioning can also supported. In one example, there are three standard views for objects as pages:

Object as Page (Records and Documents)
Entry as Page (Records)
Object List as Page (Records)

Certain types of objects can be viewed as pages. This can include records and documents attached to pages. This view depends on the given page to have embedded in it a page component that knows how to display the given object. For example, the standard Record Object as Page can use the Record Detail component; on the other hand, the standard Document Object as Page can use the Document Detail component. These components handle operations such as updating the object, and deleting the object to which they are bound. All of these pages support an operation currently called "Decoration". Decoration is identical to page-editing, except that it's done in the context of an Object as Page. The distinction here is that there are certain modifications to the area into which users can add content.

Pages are designed to allow users to add net new objects to a collection. In one example, adding net new records to data sets can be supported. When users navigate to a given Entry as Page, the first thing they should see is a blank form (this is actually an empty Record Detail component). Else, they are navigating to an existing record, in which case they would actually be looking at an Object as Page. Entries as Pages support "decoration" in the same way that Objects as Pages support "decoration".

These pages are designed to allow users to view multiple records in a given data set via this page construct. The default component used to display these records is the Data Table. Much like Objects as Pages and Entries as Pages, these pages can be "decorated" by users.

Each Object, such as Page, Entry as Page and Object List as Page can have its own unique URL. This can allow users to navigate to these views from outside of Constructor (which lets them do things like e-mail around links, etc.). When the name of the given underlying object changes, so can the URL, except in the case of documents, who's URLs are bound to IDs rather than user-specified names. URLs to records are also ID bound, but they do include the name of their owning record set, which could be updated by users.

Constructor need not create or store Objects as Pages until those pages are decorated and subsequently published by users. Also, these pages can be persisted when Annotations are added to a page (even if the page hasn't been decorated).

Every Object as Page can have one or more base components it uses to display the given object to which the page is bound. In the case of regular Objects as Pages, the default view can contain a Record Detail Component, in the case of document Objects as Pages, the default view can contain a Document Detail component, and so on. There are cases, however, where other components may be used (in the case of Applications, for example). These base components may differ slightly in functionality from their regular versions: for example, the normal Record Detail component that can be added to any page supports paging between records using an AJAX operation (the page doesn't refresh). In the case of the Object as Page version, paging between records actually navigates the user among each of the URLs for each of the records in the given record set. Some components in the system may only be available via Objects as Pages (such as the blog and document detail components). This list will be finalized as we near feature complete.

Objects as Pages can be versioned just like any other page. In one embodiment, only decoration-level operations are tracked, and not changes to the underlying object. So, for example, if I go to an Object List as Page and add a new record via the Data Table, I'm not actually incrementing the page version. Page versions are only added when a user decorates a page (adds/removes/updates component).

Users can attach documents to Objects as Pages in the same way they can to regular pages. These documents need not be associated with the underlying data in any way. In one example, if a user attaches a document to a Record Object as Page, Constructor doesn't automatically add a File Attachment field to the underlying record.

Users can annotate Objects as Pages in the same way they annotate regular pages.

When decorating an Object as Page, there may be restrictions as to where users can add content. By default, Objects as Pages will have a primary page component at the top of the page, and then a blank content area beneath that. In one embodiment, users are only able to add and manage components within this content region. In one example, users cannot add new components to the left, to the right or above the Object as Page primary component.

The Applications feature can make heavy use of Objects as Pages. Here, Objects as Pages act as the View for these Applications. These Applications may each have their own custom implementations of Objects as Pages (for example, the blog application may use a blog component in the Object List as Page view rather than a data table). This is defined in more detail in the Applications feature specification.

Objects as Pages can be persisted as part of the object they represent. Implications here are: if you create a Record as Page and then delete that record, that page is subsequently deleted as well.

Figure 4:
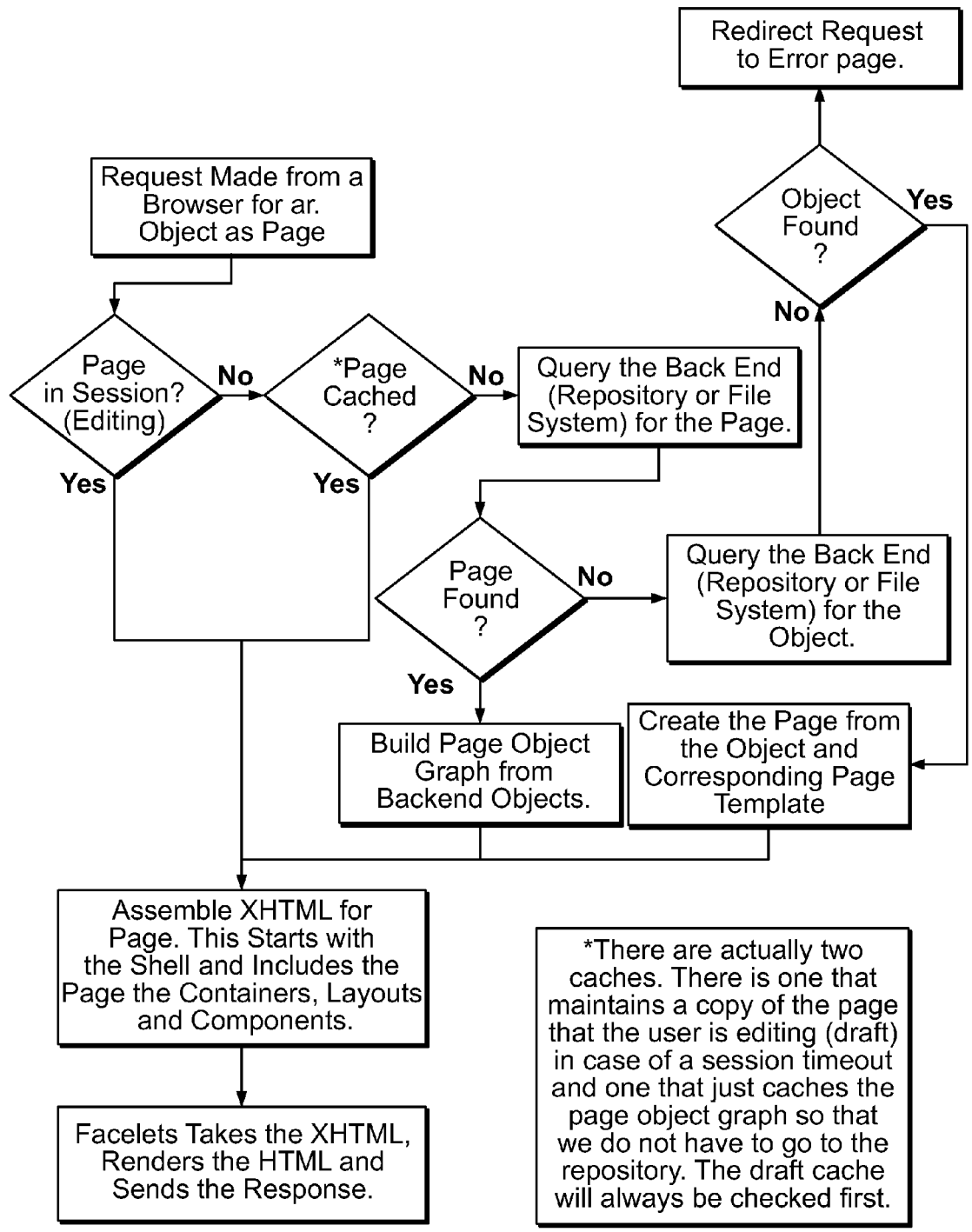
FIG. 4 illustrates a request path for an object as a page.

FIG. 4 shows an example of a request path for an object as a page.

Live Spaces can provide a natural way to group pages, and to provide for those pages a common access control list, which makes it easy for Live Space managers to decide who should be able to see and do what in a Live Space, and the pages contained therein.

Users with appropriate access can create new Live Spaces. To create a new Live Space, users can either click a button in the Dashboard, a button in the Read mode toolbar, or when creating a new page. In the first two cases, this pops up a wizard. In the case of creating a Live Space when creating a new page, this is done in line, in the page wizard. When creating a new Live Space from scratch, users can define a number of settings. These include: Title, URL, Description, Home Page, and Security. When a Live Space is first created, the Home Page can be created by default. When a user is finished filling in these settings, they can click Finish, and are navigated to the home page of the new Live Space.

Users with appropriate access can modify an existing Live Space's settings. All the settings described above can be modified after a Live Space has been created. If a user changes the URL for a Live Space, and hits Finish, the browser can reload the page to display the Live Space with the new URL.

Users can specify a page for a Live Space, which acts as the default page when anyone tries to navigate to the Live Space directly. For example, if a user types in a URL like http:// . . . /ls/foo, they are immediately navigated to the home page for the 'foo' Live Space. At any time, users with appropriate access can change the home page of a given Live Space. If a page set as a home page is deleted, the system will alert the user of the fact that they are deleting the given Live Space's home page, and give them the option to switch to another page as the home page.

Users can view general properties for a given Live Space by launching the wizard for that Live Space. In one embodiment, this tab in the wizard only shows up after a Live Space has been created. This tab can include system information such as: date created, date modified, created by, and so on. None of these properties need be editable. Live Spaces can be represented in the system by a LiveSpace object, which can contain properties for all the configurable settings noted above. The LiveSpace object can be persisted in the repository as a node (and on the filesystem as an XML file). In the repository persistence implementation, the pages for a given LiveSpace can be represented as child nodes under the parent LiveSpace node. While, in one embodiment, certain nodes under the LiveSpace (pages, documents) are versionable, the LiveSpace node need not be. Within the Constructor service tier, LiveSpace objects can be cached, thereby reducing the need to make a remote repository request every time a LiveSpace is requested. In terms of exposing the LiveSpace object through the UI (exposing properties like the LiveSpace name as text on the page, or editing LiveSpace properties via the editor), there are several mechanisms through which this can be surfaced. One is through Facelets and a LiveSpace "backing bean", which allows properties on the LiveSpace to be rendered in the UI via certain expressions (EL) in the template's tags. The Live Space editor can update settings on the LiveSpace object by way of the DWR LiveSpaceService, which can expose methods to the client tier (such as JavaScript) to create and update LiveSpace objects. Navigating to a Live Space by means of a URL can be handled by a "resource resolver" class, which will parse a URL, and from it, extract the Live Space name (what is types into the URL field in the editor). From the Live Space name, we can look up the Live Space, get its home page, and render it.

Page Components can be UI elements which can be added to pages by users. Page components can be bound to back-end data provided by Constructor or a third-party data source, or can simply contain static content, or content keyed off of the preferences assigned to a given component. Out of the box, Constructor can ship with a number of page component types, a list from which users can pick to create new page component instances. These can include: Data Table, Image, Record List, Text, and so on.

Any time a user adds a page component to a page, or clicks the Edit Settings button on a page component, Constructor can pop up a Component Editor, which most of the time takes the form of a wizard. The first time a user adds a component to a page, the workflow can be: add component to page->pop up wizard->fill in settings in wizard->click finish->refresh component to reflect settings. Users can also cancel out of a wizard during that workflow to cancel adding the component to the page. Users can also access these wizards after adding a component to a page. Clicking finish or cancel here updates the component, or cancels out any settings changed in the wizard.

Every component in Constructor can have a URL that can be used to access that component directly. In one embodiment, users can get access to these URLs by either (a) clicking on the component name in the component title bar (for components that have title bars), (b) by viewing the properties panel for a given component (for components that have wizards/editors), (c) by searching/finding the component in the Explorer panel and then navigating to the component or (d) by searching/finding the component in the Organizer and then navigating to it.

In one embodiment, when viewing a page component via a URL, there's a specific page component shell that wraps the given component. This can take two forms: (a) user-friendly and (b) portal-ready. In the case of (a), the shell simply displays the page component title and description within the shell; in the case of (b) the shell are completely blank and only displays the contents of the component (not even the title bar). The purpose of (b) is to allow displaying a single page component as a portlet in the portal, where you want to let the portal govern things like toolbars, and so on.

Page components can be shared across pages.

Page components need not versioned on their own, or saved on their own. Page components can be versioned and saved as part of a page save operation.

Page components, when removed from a page, can be effectively deleted. Users can go back to an old version of a page to get the component back.

This can increments the page undo/redo stack, meaning, if I change the settings for a given component as part of a page editing session, I can undo those changes.

A Data Table component can expose records in DataSpaces. It can support various modes:

1. Simple: simple mode can simply lists out the records in the DataSpace to which the Data Table is bound. The record title field shows up as the first column, and is a required column. The contents of the title column are hyperlinked. This hyperlink can navigate users to the corresponding Record Display page.
   I. Master-Detail: master-detail mode can list out the records in the DataSpace to which the Data Table is bound. The record title field can show up as the first column, and is a required column. The contents of the title column can be hyperlinked. This hyperlink can display the selected record in the detail view.
   I. Spreadsheet: spreadsheet mode can list out the records in the DataSpace to which the Data Table is bound. The record title field can show up as the first column, and can be a required column. The contents of the title column can be hyperlinked. This hyperlink can navigate users to the corresponding Record Display page. The spreadsheet mode is special in that it lets users modify the contents of the table as if it were a spreadsheet (aka in-place editing).

These modes have a lot of functionality in common:

View: a given table instance can define the maximum set of columns that are available for display in the Data Table. This view is a subset of the total set of fields for the given DataSpace. This view can be configured in the Data Table wizard, and can be expressed as a simple multi-select menu. In a view, users can also specify the default sort column and sort condition.

Show/hide columns: this can be a runtime option (i.e., its state is not saved across sessions) that lets users hide and show columns given the set defined by the given Data Table's view.

Add row: users can add new records to Data Tables. In Simple mode, this can be done by clicking the Add Record button, which navigates users to the Record Entry view for the given DataSpace. In Master-Detail mode, this can also done by clicking the Add Record button, except that rather than navigating users to another page, it can pop open an empty detail view, wherein users can supply the data for the new record. In Spreadsheet mode, there can always exist a blank row at the bottom of the table, wherein users can add new data in place.

Delete row: users can delete records in a given DataSpace. In Simple mode, this can be done by selecting one or more rows (via a checkbox) and clicking either the Del key or the Delete button. In Master-Detail mode, this can be done by selecting the row, and clicking the Delete button in the Detail view. In Spreadsheet mode, this is done by selecting one or more rows (via checkbox) and clicking the Del key or the Delete button.

Add field/column: if this Data Table is backed by a read/write DataSpace, clicking this button pops can open the DataSpace editor, and lets users modify the field settings for the given DataSpace.

Sorting: users can sort columns.

Paging and Page Size: in the view for the Data Table, users can specify the paging size for the Data Table. Once this is specified, users can take advantage of paging controls to page back and forth on a DataSpace.

Each mode can also have some unique characteristics:

Summary column: in simple mode, the right-most column can always called Summary. This Summary column can concatenates all the name/value pairs for the columns which aren't displayed. This does not include fields not in the view.

The Record List component is designed to allow viewing sizable DataSpaces in a compact, filterable UI.

Once a DataSpace is specified, the following features can be available:

Summary View: the Record List concatenates the contents of each record into a compact view: the title field value is the title of the summary view, and the rest of the fields can be concatenated into a name/value, comma-delimited string.

Filtering: users can filter on the contents of the records appearing in the Record List. This is a full-text search on the entire contents of a given record, or set of records.

Paging: the Record List can support paging in the same way the Data Table does.

Search component can be identical to the Record List, except that instead of being backed by a DataSpace, it can be backed by a search result set. In one embodiment, the following features can be supported:

Query: users can specify a string that's used to full-text search for objects in Constructor.

Object Type: users can specify a set of object types that can be used to constrain the result set.

Sorting: users can specify sort conditions, based on Title, Relevance or Date.

Once the query is defined, the UI for interacting with the results is:

Summary View: the Search can concatenate the contents of each search results into a compact view: object title, object description, object last modified, and so on.

Filtering: users can further filter the contents of the result set, which effectively appends the principal query string with an AND operator, and the contents of their new filter query. The effect is to further scope the result set.

Paging: the Search component can support paging in the same way the Record List does.

Users can add comments, and engage in message-board style discussions, in the context of every page in the Constructor system. This can provide a simple way for users to provide structured feedback to the page. In addition, it enables things like commenting on blog posts in the context of blog DataSpaces.

Users can add comments to any page (or type of page) in one of two ways: (a) via the Add Comment button in the toolbar or (b) via the Comments page component. In the former case, this can pop up a simple editor with a single text box into which a user can add a plain-text comment. Upon hitting the Post button, the comment can be posted. If any of the comment display UIs are shown (discussed below), those UIs can be refreshed to display the new comment. In the latter case, clicking Add Comment inside the page component toggles open a text box into which a user can add a plain-text comment. Upon hitting Post, the page component can refresh.

Given appropriate access, a user can update an existing comment. To do this, a user can click the Edit button next to a comment. Depending on the UI, this can either pop up an editor (from Comments Info pane) pre-populated with the comment, or display an in-line text box (from Comments page component) pre-populated with the comment. Users can save their changes, or Cancel out of them.

Given appropriate access, a user can delete an existing comment. A confirmation dialog pops open when the Delete button is clicked.

Users can reply to top-level comments. Replies to replies need not be supported. Adding, editing and deleting replies are identical to doing that for top-level comments.

Comments can be ordered, at each level (either the top level or the reply level for each top-level comment) by date descending, i.e., the latest comments are listed first. There is no UI for sorting.

In one embodiment, only one comments page component is used per page.

As a user edits a page, Constructor, can keep track of all their changes. In addition, when a user saves a page, Constructor can automatically create a new version of that page. As a page's version history builds up, users can revert to old versions of pages, can delete old versions of pages, and can even navigate to and view old versions of pages.

The same applies to documents, except that instead of navigating to old versions of documents, users can download old versions of documents. Page editing can be equivalent to document uploads. When editing a page, users can have the option of either saving the given changes as a draft, or publishing their changes. When users save their changes as a draft, they effectively are not versioning the page, but instead are keeping their changes around for later review. Once a user is ready to submit their changes to the system, they can click Publish, at which point a new version of a page is created, and that version can be set as the "active" version. Any time a user navigates to a given page, they can effectively navigate to the "active" version. In one embodiment, the case of documents, there are two ways to add a new version: (a) users can upload to a page a document, and if that document has the same name as a document already attached to the given page, then that document is added as a new version of the existing attached document, or (b) users can upload to a specific document a new version, and even if the names are different, the new file is treated as a new version of that existing document.

Users can revert to any version of a page that exists in the system. After reverting to an old version of a page, say from version 10 to version 6, versions later than the now "active" version need not be deleted (versions 7-10 are not deleted). Reverting can be performed to an older version, or a newer version, given the relative position of the "active" version. Users can revert to a later version from a previous version. When users revert to an old version, and then publish that version (after perhaps making some changes), the new version is tacked on to the very end of the version history, and is marked "latest". The same exact behavior applies to documents (except uploading replaces publishing).

Users can delete any given version of a page, or all versions of a page (which effectively happens when you delete a page). When a given version is deleted, holes are left in the version history. This is to make clear to users that a given version, which may have had a specific purpose or meaning, is now gone. There need be no other way to see that a given version has been deleted.

Users can navigate and view the contents of a given version (via the Explorer panel). When viewing that version, they can click a button to revert to that version, or delete that version. There is no UI for immediately making changes to that version—i.e., that non-active version is read-only. In the case of documents, users can download any non-active version.

Modifying page settings versions a page.

Page component settings can be versioned with a page. So if you revert to a different version, settings on components may be different.

Annotations and documents need not be versioned with the page; annotations are not versioned, and documents are versioned independently.

These are versioned as pages, independent of their underlying objects. All the same page versioning functionality can apply.

Customers can deploy Constructor in various ways: (a) stand-alone, (b) behind a product like Runner and (c) behind a product like ALI (formerly known as the Plumtree portal). To be able to deploy Constructor behind ALI, several features are offered, tackling things like navigation-level integration, portlet-level integration and gateway-level integration.

With the Constructor installer comes a navigation tag that can be deployed into portal navigation components. In most cases, this tag will be deployed inside the out-of-the-box portal header, or a modified version of the out-of-the-box portal header. The portal has two types of navigation: pluggable navigation and tag-based navigation (Adaptive Tags). Via portal Experience Definitions, customers can create rules to determine which type of navigation to display on a given portal page. In the case of tag-based navigation, portlets can be used to render out the portal navigation scheme. In this case, the portal header can be a portlet (aka, a Web application that produces HTML), and is built out of HTML and XML tags. In the out-of-the-box portal header, there are some default tags: one to list out My Pages, one to list out Communities, and so on. These tags are primarily 'pt:ptdata' tags, which are then wrapped by 'pt:plugnav' tags for actually rendering out the data as HTML/CSS/JS. Constructor can ship an additional LiveSpaces data tag that can be inserted into this portal header portlet to list out LiveSpaces next to My Pages and Communities. This tag, when rendered out on the page via a UI tag, list out all the LiveSpaces to which a user has access. When a user clicks on one of these LiveSpace links, they can then be navigated to a gatewayed Constructor page (the home page for the given LiveSpace run through the portal gateway).

When viewing a Constructor page via the portal, it can be a requirement that the Constructor page be gatewayed. Gatewaying is a simple concept: when attempting to view a Constructor page via the portal, the user (really, the user's browser) makes an HTTP request to the portal with a URL that the user wants to see, the portal then parses this URL and figures out that the user wants to see a specific portlet, the portal then makes an HTTP request for that Constructor page (which was specified via the URL), get back the HTML/CSS/JS etc. from Constructor, "transforms" that markup (makes all of the URLs gatewayed URLs), and then finally returns that HTML to the user's browser. Gatewaying a page also allows the portal to scan the page and replace any Adaptive Tags with their corresponding HTML/CSS/JS (this is used to support the LiveSpaces menu and injecting the portal header into the Constructor shell). User identity propagation can also do via the gateway. When the portal makes a request to Constructor it can send along user information, which Constructor can then uses to figure out whether or not a user should have access to a given resource.

By default, when viewing Constructor through the portal, and when the appropriate Experience Definition is set up, the portal header can automatically appear at the top of the Constructor page. This can be supported by a custom Constructor Adaptive Tag, which is embedded into the default Constructor shell. When the portal transforms the Constructor page, it can see this Adaptive Tag and insert the portal header HTML. As described above, this HTML can include a menu which lists out Live Spaces. Customers have the flexibility to modify their shell, and place this header insertion tag wherever they want.

Constructor can include a portlet template that can be deployed to the portal to allow users to create new portlets based off existing Constructor page components. When creating a new portlet, users choose the Constructor Page Component Wizard, wherein they can choose an existing Constructor page component to which they have access. Once they choose this page component and hit Finish, this choice is stored as an Administrative Preference for the new portlet instance, and whenever that portlet instance is displayed on a portal page, it can dynamically surface the given Constructor page component. There are a couple security implications here: (a) a user cannot select a page component to which they don't have access and (b) a user cannot view the contents of a Constructor portlet which contains a page component to which they don't have access. In the latter case, a friendly error message can be displayed. Unfortunately, we can't just hide the owning portlet. At any time, given appropriate portal access, users go back and point at a different Constructor page component. There are no restrictions in place to prevent a user from deleting a Constructor page component being surfaced in the portal. Here, we'll again display a friendly error message telling the user that the content no longer exists. In general, page components should "work" and look just like the page components do inside of Constructor.

Figure 5:
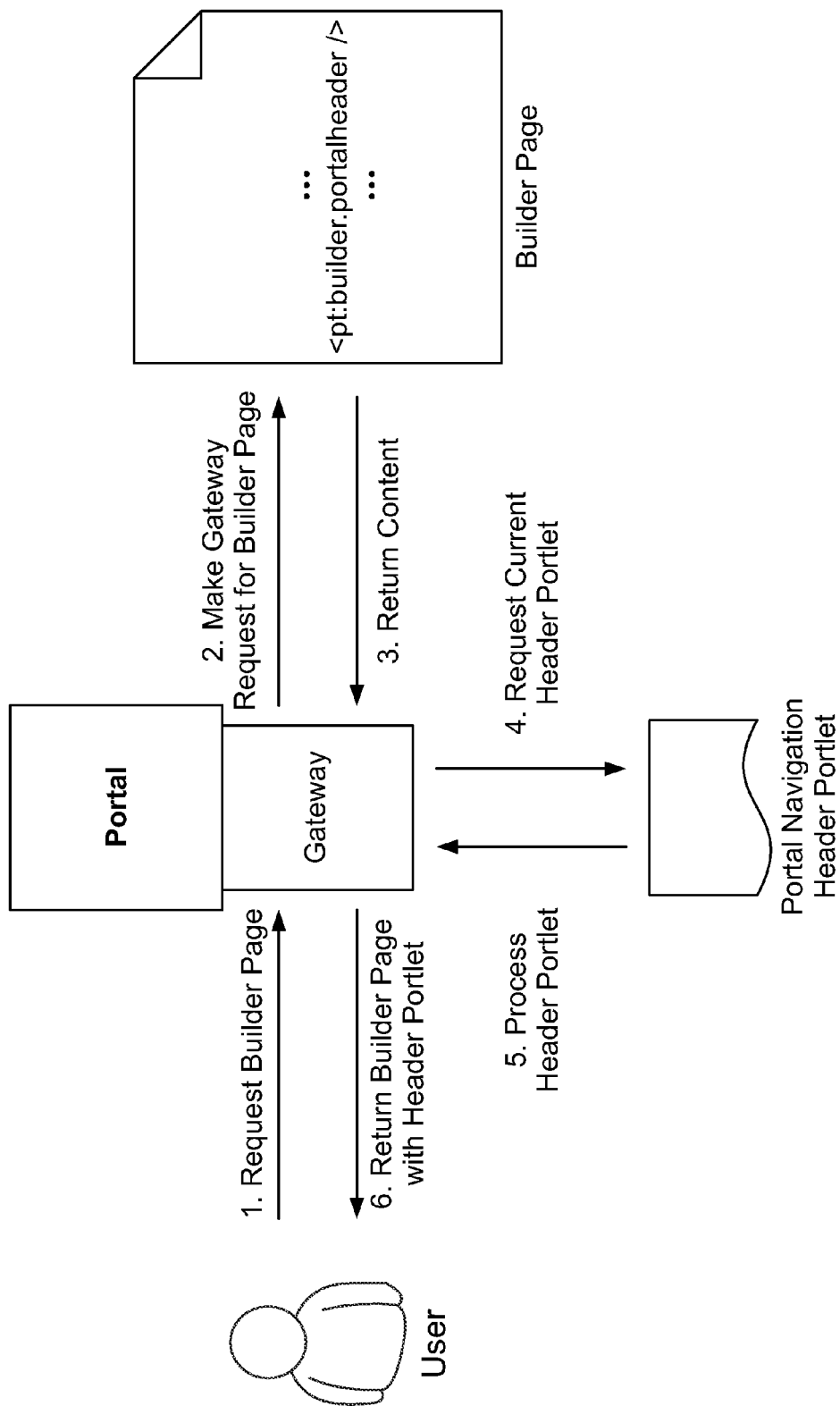
FIG. 5 illustrates a gatewayed page with header diagram.

FIG. 5 shows an exemplary Gatewayed Constructor Page with Header Tag Diagram.

Figure 6:
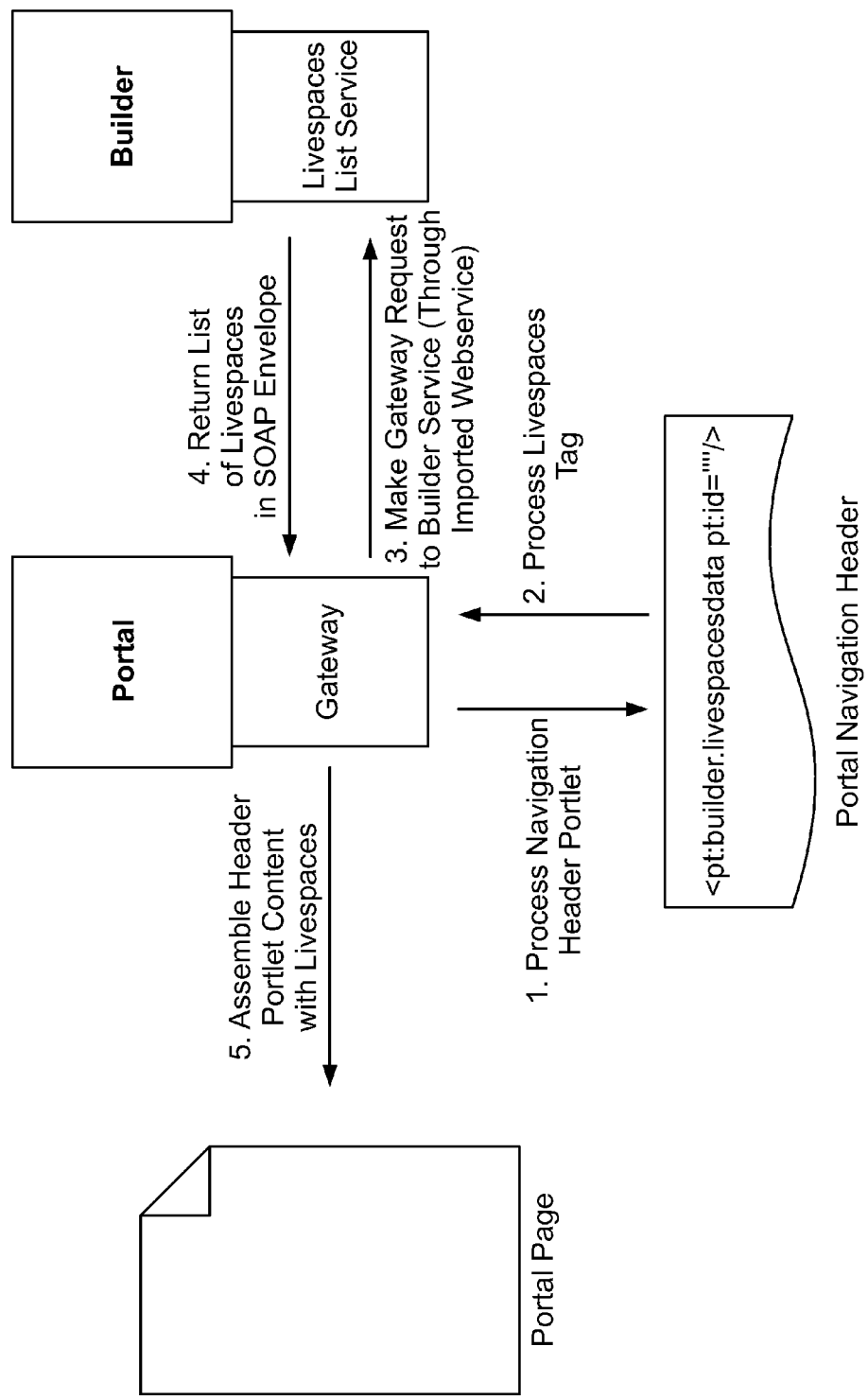
FIG. 6 illustrates a LiveSpaces tag diagram.

FIG. 6 shows a LiveSpaces tag diagram.

DataSpaces can allow Constructor users to create a full-blown UI for managing data. There can be a few DataSpace templates that ship with Constructor, e.g., RSS, blogging, and so on. In addition, users can create a DataSpace from scratch. Once a DataSpace is created, users can access the data in the DataSpace via a set of different URLs, each unique to the DataSpace and the type of view on the data that URL provides.

Use Cases: users can create DataSpaces for tracking things like feature lists, to-dos, customer phone calls, project tasks, and so on. In addition, DataSpaces will prove valuable for blogging, and for keeping track of information published by other Web sites (via RSS). DataSpaces can be important in that they let users add structured and unstructured content to each of the views they express. So, for example, you could imagine that for each feature listed in a feature list, one could attach rich text, documents, images, and even further, additional DataSpaces around a single feature.

To create a new DataSpace, users can navigate to the Dashboard, and click the Create a DataSpace link. This can pop up a wizard. The first step users must take is to specify a template for their Data Space. Out of the box, there are several templates: blog, custom, and RSS. In addition, customers can add new DataSpace templates to this list, which key off data provided by external Web services. In total, there are three "types" or "sources" of data: Local (blogging, custom, etc.), RSS (only RSS) and External (all the Web service based DataSpace templates). This partitioning is mainly an artifact of the server-side implementation of these DataSpaces, but also serves to help users decide the type of DataSpace they want to create. In one embodiment, only Local DataSpaces are read/write; all others are read-only. Once a user picks a DataSpace template, they are then navigated to a separate wizard, specific to that type of DataSpace. The next few features outline those. Common to all DataSpaces, however, is the fact that each has a Title, a URL, and a Description. This can make it easy to find (and navigate to) the DataSpace in the system once it has been created. Once one of those DataSpaces is created, the user can then navigated to either (a) the component where the DataSpace will be surfaced or (b) to the List view for the DataSpace. This navigation decision is based on where the DataSpace was created from.

Once a user decides they want to create a custom DataSpace, either to display this DataSpace in its native UI, or via a page component, they can be taken to the Custom DataSpace Configuration Wizard. In this wizard, users can specify a set of fields for the DataSpace. Each of these fields has a set of properties: Field Title, Field Type, Display Order, Is the Title Field?, Is Required?, and in the case of a DropDown field, the options that show up in the DropDown menu. Users can specify any title for each of these fields; users can specify the field type: Text, MultiLineText (shows up as an HTML textarea), RichText (shows up as a rich text field) and DropDown (shows up as an HTML select menu with options) and DynamicDropDown (shows up as an HTML select menu with options). Users can go back at any time and modify each of these settings.

Blog DataSpaces, like custom DataSpaces, can store their data inside the Constructor repository. The main difference between custom DataSpaces and blog DataSpaces is that Blog DataSpace has a pre-defined set of fields, whereas custom DataSpaces let users define any number of fields. In addition, Blog DataSpaces have a pre-defined set of page templates to display their records. To create a Blog DataSpace, a user simply has to specify a Title, URL, and Description, and then hit Finish. This then navigates the user to the appropriate UI (either displaying this new Blog DataSpace inside a data-bound component, or navigating them to the Entry view so they can start entering new blog posts). Notable differences for Blog DataSpaces: (a) the List UI: the List UI for Blogs is formatted to look like a standard blog, also the List UI includes an Archive to display all blog posts that don't fit into the default List. The limit is 10 posts on the front page. Also, the Display UI for blog posts (records in the Blog DataSpace) is slightly different in that the UI for display the record is better fitted to a blog post (that has a defined set of fields like Title and Body); this UI also includes by default a Comments page component, so that users can comment on the given blog post. This functionality can take advantage of the Objects as Pages feature in Constructor, where any record can be viewed as a page, and treated like a regular page.

When defining a custom DataSpace, users can specify the set of fields that make up that DataSpace. This functionality is only available when creating a custom DataSpace. When creating other types of DataSpaces, such as blogs, RSS, etc. these fields can be pre-defined for the user. In one embodiment, there are a few types of fields that are offered out of the box: (a) Text: text fields are surfaced through the UI as HTML text inputs, (b) Multi-line Text: multi-line text fields are surfaced through the UI as HTML textarea inputs, (c) Rich Text: rich text fields are surfaced through the UI as WYSIWYG inputs, (d) Dropdown: dropdown fields are surfaced through the UI as select pull-down menus with a static list of options, (e) Dynamic Dropdown: dynamic dropdown fields are the same as normal dropdown fields, except that they are dynamically populated with the contents of another DataSpace. When adding a field to a DataSpace, users can specify a Title for that field; this then is used to display the title of a given field in DataTable columns, or as labels in a Record Entry component. Also, users can specify which field in a DataSpace should be used as the Title field; this is then used whenever the "title" for the record needs to be displayed (in search results, in dynamic dropdowns, etc.). Users can then specify whether a field is required, which is then enforced via the Record Entry component. Display order can govern the ordering of the fields when displayed via the Constructor UI. This ordering can manifest itself as either top-to-bottom (e.g., in a Record Entry view) or left-to-right (in a DataTable or Record List). Display order is only relevant for certain types of displays; e.g., the Blog Display view doesn't pay attention to the display order property, i.e., the blog post title field will always be displayed at the top, in bold. You can change field types at any time, with the exception that you can't switch to Dropdown or Dynamic Dropdown. Users, at any time, can delete fields from a custom DataSpace.

Users can create DataSpaces which pull their content in from an external RSS feed. When creating an RSS DataSpace, users simply need to specify a URL for the given feed, and if the feed is secured, a username and password. Once this information is supplied, users can navigate to a List view or a Display view. The List view, like with the blog DataSpace type, is custom to RSS. Also, RSS is read-only, so there is no "Entry" view. There is nothing particularly worth noting about the RSS view overrides other that they are slightly different to allow easier browsing/reading of the RSS data. At any time you view a feed or an item, the RSS feed is requested. This means, it's expected that the feed or a given post should display real-time data. Users can update the RSS URL at any time. If a user changes the URL for an RSS feed, and if an Object as Page exists for a given post item, those Objects as Pages will be left around for posterity.

Dynamic dropdown can be done.

DataSpaces in page components in one example. For example, if I create a Feature List DataSpace, I can then add a DataTable to a LiveSpace page, and then display that Feature List inside of that DataTable. Constructor can allow users, when specifying a DataSpace for a page component, to create a new DataSpace at that time, or use an existing DataSpace. When choosing an existing DataSpace, it can be pretty straightforward: the user finds the DataSpace, hits Finish, and then it shows up in the component. On the other hand, if a user is creating a new DataSpace to display it in a component, the workflow can follow as such: (1) open the page component wizard, (2) specify that you want to create a new DataSpace to populate the given page component, (3) click Finish (4) the DataSpace Configuration Wizard pops open, (5) user does all the DataSpace configuration work described above, (5) user clicks Finish, (6) the LiveSpace page refreshes to display the newly created DataSpace inside the component. At any time, users can go back and change the DataSpace that shows up in a component. Users can navigate to DataSpaces created via components in the same way they can navigate to DataSpaces created via the Dashboard.

To update a DataSpace, users can navigate to the DataSpace and click the DataSpace Settings button, or can open the DataSpace wizard from the Organizer. Either way, the DataSpace Configuration Wizard pops open for that particular DataSpace type. At this point, users can change any of the settings for the DataSpace, within limits. The constraints are described above.

To delete a DataSpace, users can pop open the Configuration Wizard and click Delete DataSpace. This deletes all records in the DataSpace, and all of the Object as Pages created from any of those records. Once the DataSpace is deleted, there need be no way to recover it.

Because Constructor will be sold to large organizations, it provides a core set of functionality around securing the data and functionality it provides. The ability to govern who can do what in the system makes it possible for users to enter sensitive business information into Constructor without the risk of that information leaking to users who really shouldn't have access. Following the core characteristics of the Constructor system, security decisions are designed to be made, understood and interpreted by end users. Security can be applied at a fairly global level, at which point it can cascade down to child objects. This makes it easy to secure objects once, and continue working. Alternately, a more granular approach can be used.

For a given securable container, such as (a) system, (b) LiveSpace or (c) DataSpace, a given user can have one of many roles. The set of roles in Constructor can include: Guest, Reviewer, Creator, Publisher, Editor, and Administrator. A user having a given role can mean that user has a certain collection of privileges, which let them perform a certain set of actions within that given container. Moreover, having a certain role for a given container can also mean that a user can see certain data within the given container. For each of the containers described above, Constructor can ship a fixed set of roles a user can have. The roles for each container differ slightly, and are described below. It's worth noting that groups can also have roles, and that by being a member of a group that has a role, a user assumes that role.

Roles can be collections of privileges. In one embodiment, there are a static set of privileges: EDIT-LIVE SPACE, ANNOTATE-PAGES, CREATE_PAGES, DELETE ALL_PAGES, EDIT-ALL-PAGES, READ_PAGES, EDIT-ALL-AN NOTATIONS, DELETE-ALL-AN NOTATIONS, EDIT-RECORD SET, CREATE_RECORDS, DELETE-ALL-RECORDS, EDIT-ALL-RECORDS, READ-RECORDS, EDIT-ALL-RECORD-AN NOTATIONS, DELETE-ALL-RECORD-AN NOTATIONS, ANNOTATE-RECORDS. This list of privileges is hidden from end users. The roll-up of these privileges, however, can be exposed to users via roles. Therefore, when a user has a given role, they then can have a collection of these privileges. These privileges help govern what a user can see and do in the system.

Constructor can rely on a short list of groups to govern security at a system level. These groups include: Constructor Administrators, LiveSpace Administrators, and DataSpace Administrators. The implications of being a member of one of these groups are described below.

Constructor can let users define ACLs (access control lists) for LiveSpaces and DataSpaces. ACLs help the system decide what a user can see or do for a given container (LS or DS). ACLs take on a very simple form, they are a list of principal/role pairs, where a principal is either a user or a group, and a role is one of the roles described above. Users can choose users and groups with the user and group picker, which can be populated with users and groups from the ALI database. The ACL UI can allow full CRUD operations on the control list.

Security evaluation can be done when a user tries to access a given resource or perform a given action. When this happens, a few things can occur: (a) the user is in a role that has the ability to see the given resource, or perform the given action on the given resource (b) the user is in a role that can see the resource, but can't perform the given action on the resource or (c) they can't even see the resource to begin with (this won't happen very often—if it does, it's because a user has gotten a hold of a URL to an object to which they don't have access). Because security is applied at the container level, security evaluation can be done against the ACL of either the object in question (if the object in question happens to be a container itself, like a LiveSpace), or a parent container of the object in question (e.g., if I'm trying to access a page, a document, a record, etc.). If a user doesn't have the ability to do something, an exception propagates to the UI. This takes the form of an error page, which lists out why they can't do what they're trying to do.

Constructor need not store information about users and groups, and can instead rely on a portal product to do so. Any time a user tries to do something in Constructor, their user identity can be retrieved from either the portal or other session, and the mapped against the corresponding ACL (which would include a role that is mapped to a portal user or group they're in). Group membership evaluation can be done at runtime (but may be cached).

Whenever a container object is created, a default set of principals can be added to the ACL for that object. This default set can include: (a) the portal Administrators group, (b) the principal who is creating the object. This default list can be extended/modified by customers via an unsupported feature known as security templates.

Whenever a user performs an auditable action (modify, create, etc.), that can be stored with the given object. Through the UI, this action can then be displayed; e.g., Michael created this page. This can always display the appropriate name associated with the given user object in the portal. If the name changes on the portal object, the name in Constructor should update wherever that user performed an action.

The Action Pane can provide a base set of functionality that allows users to interact with content surrounding a given page (or record page). This can include: other pages (or record pages), documents, records, DataSpaces, and so on. Usually, a user will use the Action Pane when they want to navigate to another object in the system.

"This Space" is a section of the Action pane that can list out all of the objects included in the DataSpace or LiveSpace a user is viewing. When viewing a page or document page in a LiveSpace, this list can include: pages and documents. When viewing a record list, record entry, record display, or document page in a DataSpace this list can include: records and documents. In one embodiment, by default, when a page first loads, the This Space section can display at most ten items (which is at most five items of each type). The list can group the items by type, and in each section sorts the items by title (alphabetically). Users can expand each group of items to display all of the items of the given type (all of the item of that type in the given space). Users can also choose to search for items in the given space. Here, there can be a search box; when users type in this box, the list of items updates dynamically (as they type). This query is identical to running a simple text query in the Organizer. Here, search results are returned grouped by type and ordered by relevance (based on the query string). Each search result is a hyperlinked title (or name if title doesn't exist) to the given object. No more information is provided in this list.

"All Space" can be the same section as This Space, except the filter is scoped to include all spaces in the system (all LiveSpaces and DataSpaces). This can work just like the This Space section except that all types of objects are returned from across the entire system.

"Attachments" can be a list of all the documents attached to the given page (page, record list page, record entry page, record view page). Document pages need not have attachments. In one embodiment, like the This Space section, by default, at most ten items are displayed. Users can choose to expand this list to display all of the documents attached to the given page. These documents can be sorted alphabetically (just like the items in the This Space/All Spaces list). This can also be just a list of hyperlinked names/titles. Clicking on these links navigate users to the document page for the given document. The only addition is that under each link is a download link, which is a direct pointer to the attachment file.

Every page in Constructor can have version history—every time a page is shared, a new version can be stored in the system. The Action pane can display the list of every version of the page, sorted by date created, descending. Using this list, users can navigate to and view an old version, and when viewing that version can perform a variety of actions—Revert to the version or Delete the version. The version history list can also include the comments entered in by users when they shared the given page. By default, when the page loads, only the last five versions are displayed. Users can toggle this list to display the entire version history for a given page.

Comments can be part of every page, and by default, appear at the bottom of the page. This UI lists out the last five top-level comments on the given page, and their replies. There can be a link which expands the list of comments to display all comments. To add a new comment to a given page, a user can click the Add a Comment link at the top of the comments list. This can display a simple text area into which a user can type text. Potentially malicious content can be striped out. Once a comment is added, it can be added to the top of the list. The remaining set of functionality is described in detail in the Comments feature specification.

When entering Write or Design mode, the Action and Comments panes can be hidden.

The Dashboard can be Constructor's home page. In other words, when a user navigates to Constructors base URL (i.e., /Constructor/), this is the page they say. The Dashboard can provide to users a launching point to other parts of the system. It can include a list of recent activity in the system, a list of all of the outstanding drafts a current user is working on, and a list of every LiveSpace and DataSpace in the system. With this set of information, a user can pretty quickly grasp what content is being generated in the system. Moreover, the Dashboard is the launching point for creating new top-level objects, or spaces.

"Recent Activity" can be a list of the most recently active items in Constructor. Active items are those recently modified by a user. This list is made up of pages, records, documents, LiveSpaces and DataSpaces. Each item includes the following: title/name, hyperlink to navigate to the object, date modified, and who modified the object. This list is capped at ten items, sorted by date, descending.

"My Drafts" can be a list of all the page drafts currently open by the user viewing the Dashboard. This can include regular pages, document pages, record list pages, record entry pages and record display pages. Each item can include the following: title/name, hyperlink to navigate to the page, and date last saved. This list can be sorted alphabetically in ascending order. There need be no limit to the number of drafts displayed in this list.

"Spaces" can be a compound list, displaying either (a) all the LiveSpaces in the system or (b) all the DataSpaces in the system. There is a switch in the list that lets users view one of these sets of objects. Each item includes the following: title/name, hyperlink to the space. This list is sorted alphabetically.

"Creative LiveSpace" can be a link to the Create LiveSpace wizard.

"Create DataSpace" can be a link to the Create DataSpace wizard.

"Browser Constructor" can be a link to the Organizer.

Enterprise DataSpaces can allow users to surface through Constructor data residing in other systems. This can be supported by fetching information from external systems via Web services, or SOAP, to be more explicit. Enterprise DataSpaces can be very similar to other DataSpaces. In one example, enterprise DataSpaces can be read-only. Typical use cases around Enterprise DataSpaces can involve surfacing information from CRM systems (to perhaps display customer support issues or sales information), surfacing information from ERP systems (to perhaps display inventory information), or connecting to any number of free Web services such as Google's SOAP-based search API.

The first step in allowing users to surface Web service-based data in Constructor is to create a DataSpace template for grabbing that data. Once a DataSpace template is defined (usually done by an IT developer), it can then show up in the Constructor UI, particularly in the New DataSpace wizard, as part of the list of DataSpace templates. Like local DataSpace templates, Enterprise DataSpace templates can be defined via XML files on the Constructor file system (under./webtier/record-set-templates/soap). Each of these Enterprise DataSpace XML files must contain the following properties: (a) recordSource: this must be "soap" for the system to register the template as one pointing to a SOAP endpoint, (b) recordSetURI: this can be a pointer at the WSDL URL for the given Web service (in the case of Google, this would be http://api.google.com/GoogleSearch.wsdl) (c) operation Name: this is the name of the operation that should be invoked whenever an instance of this DataSpace template is instantiated (in the case of getting search results from Google, this operation is called doGoogleSearch), (d) inputMessageName: SOAP operations require input messages (in the case of Google, this is also called doGoogleSearch), (e) portTypeName: another required pointer at the operation you need invoked (in the case of Google, this is called GoogleSearchPort), (f) binding name: another required parameter (in the case of Google, this is called GoogleSearchBinding), (f) serviceName: another required parameter (in the case of Google, this is called GoogleSearchService), (g) recordSetXPath: this is an XPath expression that points at the collection of items returned by the Web service call that you want to map to Constructor's notion of records (in the case of the XML returned by a Google search request, this would be //doGoogleSearchResponse/return/resultElements/item), (h) inputMessageParts: this is the data structure that is sent as part of the request to the given endpoint (this chunk of XML ends up being exposed to end users when they configure an instance of the given DataSpace template), recordTypeDefinition: this chunk of XML describes the shape of the "items" that are returned by the given operation. In one embodiment, changes to a DataSpace template do not apply to DataSpaces created from that template.

For an Enterprise DataSpace to be valid, it can expose a primary key field, which is a unique identifier that represents a given record (like a customer ID field for a list of customers from a CRM system). This primary key can be used in a variety of contexts, but primarily to help construct meaningful URLs to record pages for a given Enterprise DataSpace.

Like RSS DataSpaces, Enterprise DataSpaces can be read-only. The Constructor UI can reinforce this restriction by not displaying any sort of editable UI around Enterprise DataSpace data or structure (columns cannot be added, etc.).

Once a given DataSpace is defined and its records have been fetched at least once, the records can be brought into the system become part of the search collection. This means that users can search for Enterprise DataSpace records just like they can search for local or RSS DataSpace records.

Constructor can hold on to Enterprise DataSpace records, which can allow users to decorate the pages that represent those records, and also allow users to search for the given records. Constructor can update this cache when a given record is requested by a given user.

Enterprise DataSpaces don't have any special UI, other than just being read only (which is basically the same experience as viewing a local/custom DataSpace when you don't have rights to change anything).

The Organizer can be Constructor's primary search, browse and administration interface. From a single screen, users can get access to every navigable object in the system, from pages, to DataSpaces, to documents. The Organizer can provide a range of controls for grouping, filtering, and searching for items—with the intention of making it incredibly easy to find objects and perform a standard set of actions on them.

Users can get to the Organizer at any time by clicking the Organizer link at the top of every page.

The Organizer can provide a single search box, into which users can type any text. Once a user enters text, they can click the Search button, which will invoke a request against Constructor, asking for all items that match the given query. This query will look for all items whose title matches the search string, whose description matches the search string, or who "contain" the search string. Not all items can contain data. Items like LiveSpaces and DataSpaces are more containers than holders of data, so they can be excluded from content-level searches, so as to not pollute search results with a whole raft of secondary and tertiary objects (you wouldn't always want to return the parent LiveSpace for a given page, just because the LiveSpace "contains" the content by being the parent of the page that contains that content.

The Organizer lets users search for objects of the following type: page, record, LiveSpace, DataSpace, document, component. Common to these objects is the fact that they each have a URL, and are therefore "navigable".

The Organizer can let users filter search results by type. The potential options are: Any Type, Document, LiveSpace, DataSpace, Page Record, and Component. By selecting one of these objects, users can constrain the search results to being only of a particular type.

Users can filter objects based on the date they were last modified. The options are: Any Time, Today, Yesterday, This Week, This Month, and This Year. By selecting one of these options, users can constrain the search results to objects modified within the specified time range.

Users can constrain their query to only return objects where their search string only matches the title of a given object, the description, or the contents.

Users can choose to group their search results, to make it easier to digest the information that's returned. Currently, users can group by type (the object types described above, or by the Space containing the given objects. When grouping by Space, this means either by LiveSpace or by DataSpace, and a certain set of search results may include some items which live in a LiveSpace, and some that live in a DataSpace. Each grouping lists at the top the grouping container—whether it's the type of object, or the container. Each grouping can by default show five items, but presents users with the ability to display all items in a given group. Users can also choose to not group items.

Users can choose to sort search results by a number of criteria: rank, title, creation date, Last Modified date. Rank is tied directly to the rank Lucene gives search results based on the relevancy of their contents to the full-text search string.

Users can navigate to search results by clicking the hyperlinked title for the given search result. The behavior here is to drive navigation of the parent window that spawned the Organizer. The usage pattern can be similar to that of using Windows Explorer to view and open documents in Windows.

When selecting a single item, users can click the "info & settings" button to view the wizard associated with the given item. The following object types can have wizards: LiveSpaces, DataSpaces, components and pages. This button can be disabled when an object that isn't one of these is selected, or when a user doesn't have the right to modify the given object (based on security).

Clicking "edit", when a specific page or record is selected, can navigate the user to edit mode for a page, and entry mode for a record. This button can be disabled when an object that isn't a page or a record is selected. This button can also disabled when a user doesn't have the right to edit the given item.

Clicking on "delete", when a given object is selected, can permanently remove the object from the system. This action can be performed on multiple objects at once. This action, like the other actions, can be governed by security access on the selected objects. Home pages can be grayed out.

The "View Contents" link shows up for items that contain other items, this can include: LiveSpaces, DataSpaces, pages and records (really, record pages). Clicking this button can refresh the search results to display the selected item, and all the items that item contains. LiveSpaces can contain pages, documents and components; DataSpaces contain records, documents and components; pages contain documents and components; records (record pages) contain documents and components.

Groups can be toggled open and closed. The filtering/action sidebar can also be toggled open and closed.

Users can select one item at a time, or by using standard SHIFT and CONTROL (COMMAND on Macs) keyboard commands, can select multiple items.

The Data Table can be a page component that lets users interact with data via a page. Users can bind Data Tables to any type of DataSpace, and depending on the DataSpace type, can get a read-only or editable view of the given data.

In one embodiment, the Data Table can exist in one of three modes: Simple, Master-Detail or Spreadsheet. The primary difference between Simple and Master-Detail mode is that in Simple mode, adding or editing records is done via the DataSpace UI, rather than through an in-place Detail view. When a user selects to add a record, they can be taken to the New Record view for the given DataSpace, and when they choose to edit a given record, they are taken to the Record Entry view for the given DataSpace. Deleting records is identical for the two modes. Master-Detail mode includes a Detail view, which appears directly below the table any time a user wants to add a new record, or edit an existing record. The Detail view can include a form for adding or editing data, and a set of buttons for posting the given changes. Spreadsheet mode is different from the other two modes in that it allows adding and editing records in-place, just like in Microsoft Excel. Like Simple mode, Spreadsheet mode does not have a Detail view. If a given DataSpace is read-only, and a user specifies Spreadsheet mode, the table reverts to Simple mode.

To use the Data Table, users can first bind it to a DataSpace.

The Data Table wizard can give users the option of binding to an existing DataSpace, or creating a new DataSpace. In either case, the Data Table can bind to any DataSpace type. In one embodiment, when a DataSpace is read-only (such as RSS or Enterprise), the table does not supply add/edit controls. In all cases, the Data Table automatically renders a column for every field in the DataSpace. Similarly, every row in the Data Table corresponds to a record in the given DataSpace.

In any of the three modes, users can sort the records in the Data Table using any of the columns/fields displayed. In Constructor 1.0, sorting can be done alphabetically.

In any of the three modes, users can filter the records in a Data Table using a text query. As a user types, the Data Table updates to display records that contain the given text query in any of their fields.

Users can specify a page size for a Data Table (how many records show up on each page). If the total number of records in the DataSpace to which a Data Table is bound exceeds this paging size, then the given Data Table provides controls to move between each page of records. Users can jump to the first page, last page, and between each of the pages in-between.

In Simple mode, users can add new records/rows to the Data Table by clicking the Add Record button. This can navigate users to the New Record UI for the given Data Space. Once the user hits Finish they can be navigated back to the page on which the table exists. In Master-Detail mode, users can add new records/rows to the Data Table by clicking the Add Record button. This can pop open a blank form in the Detail view directly beneath the Data Table. Users can enter information and hit Create to add a new record. Depending on the filtering and paging conditions of the given table, the record may not appear immediately in the Data Table (it may be filtered out, or naturally appear in a page not displayed). In Spreadsheet mode, users can add new records by simply typing in the always-present empty row at the bottom of the table. Moving out of this row (up arrow, down arrow and Return all are valid triggers) triggers the save command.

Record editing is similar to record addition. Simple mode—users are navigated to the associated Record Entry page when they click on the record link (the first column is always hyperlinked) and are navigated back once they are done. Master-Detail mode—users are presented with a Record Entry view in-place when clicking on the record link. Spreadsheet mode—users can simply click into a cell to start editing a given record. Moving out of a cell updates the record (whereas moving out of a row creates a new record).

In any of the three modes, each row can have a checkbox that lets users select a row. Once a row is selected, they can click the Delete Record button to delete the record from the given DataSpace. The Delete Record button is only enabled if a user has delete privileges on all the records selected). The Delete Record button need not be displayed if the table is bound to a read only data server.

The Record List can provide sealable page component for viewing data from DataSpaces with a significant amount of fields/columns/records.

Users can bind Record List to existing DataSpaces, or create new DataSpaces to back them.

Sorting can be fixed at Last Modified descending. In one embodiment, this can be configured.

Users can specify a page size for a Record List (how many records show up on each page). If the total number of records in the DataSpace to which a Record List is bound exceeds this paging size, then the given Record List provides controls to move between each page of records. Users can jump to the first page, last page, and between each of the pages in-between.

Users can filter the records in a Record List using a text query. As a user types, the Record List updates to display records that contain the given text query in any of their fields.

Users add new records to the Record List by clicking the Add Record button. This navigates users to the New Record UI for the given DataSpace. Once the user hits Finish they are navigated back to the page on which the Record List exists.

Record editing can be similar to record addition. Upon clicking the Edit Record link for a given record, users are navigated to the associated Record Entry page and are navigated back once they are done.

Embodiments of the present invention can include computer-based methods and systems which may be implemented using conventional general purpose or a specialized digital computer(s) or microprocessor(s), programmed according to the teachings of the present disclosure. Appropriate software coding can readily be prepared by programmers based on the teachings of the present disclosure.

Embodiments of the present invention can include a computer readable medium, such as computer readable storage medium. The computer readable storage medium can have stored instructions which can be used to program a computer to perform any of the features present herein. The storage medium can include, but is not limited to, any type of disk including floppy disks, optical discs, DVD, CD-ROMs, micro drive, and magneto-optical disks, ROMs, RAMs, EPROMs, EEPROMs, DRAMs, flash memory or any media or device suitable for storing instructions and/or data. The present invention can include software for controlling both the hardware of a computer, such as general purpose/specialized computer(s) or microprocessor(s), and for enabling them to interact with a human user or other mechanism utilizing the results of the present invention. Such software may include, but is not limited to, device drivers, operating systems, execution environments/containers, and user applications.

Embodiments of the present invention can include providing code for implementing processes of the present invention. The providing can include providing code to a user in any manner. For example, the providing can include transmitting digital signals containing the code to a user; providing the code on a physical media to a user; or any other method of making the code available.

Embodiments of the present invention can include a computer-implemented method for transmitting the code which can be executed at a computer to perform any of the processes of embodiments of the present invention. The transmitting can include transfer through any portion of a network, such as the Internet; through wires, the atmosphere or space; or any other type of transmission. The transmitting can include initiating a transmission of code; or causing the code to pass into any region or country from another region or country. A transmission to a user can include any transmission received by the user in any region or country, regardless of the location from which the transmission is sent.

Embodiments of the present invention can include a signal containing code which can be executed at a computer to perform any of the processes of embodiments of the present invention. The signal can be transmitted through a network, such as the Internet; through wires, the atmosphere or space; or any other type of transmission. The entire signal need not be in transit at the same time. The signal can extend in time over the period of its transfer. The signal is not to be considered as a snapshot of what is currently in transit.

The forgoing description of preferred embodiments of the present invention has been provided for the purposes of illustration and description. It is not intended to be exhaustive or to limit the invention to the precise forms disclosed. Many modifications and variations will be apparent to one of ordinary skill in the relevant arts. For example, steps preformed in the embodiments of the invention disclosed can be performed in alternate orders, certain steps can be omitted, and additional steps can be added. The embodiments were chosen and described in order to best explain the principles of the invention and its practical application, thereby enabling others skilled in the art to understand the invention for various embodiments and with various modifications that are suited to the particular used contemplated. It is intended that the scope of the invention be defined by the claims and their equivalents.

What is claimed is:

1. A system, comprising:
    a memory storing a web display specification specifying a plurality of page components included in a web display, the plurality of page components comprising data retrieved from a plurality of heterogeneous data sources; and
    a processor configured to:
    receive a first page component and a second page component included in the web display;
    obtain the data from the plurality of heterogeneous data sources at least in part by:
        locating a first interface description based on an address assigned to the first page component, the address having been created as unique to the first page component, and the first page component having been associated with one or more user-specific page component changes;
        analyzing the first interface description and constructing a first service interface based on the analyzing the first interface description;
        receiving first data from a first data source of the plurality of heterogeneous data sources using the first service interface to access the first data; and
        retrieving second data provided by a second data source of the plurality of heterogeneous data sources using a second service interface to access the second data, and wherein the first service interface is different from the second service interface;
    construct the web display, displaying the first data associated with the first page component and the second data associated with the second page component; and
    control access of the first page component and/or the second page component based at least in part on one or more roles, the one or more roles corresponding to a set of one or more user privileges that allow a set of one or more actions, the set of one or more actions comprising one or more of reading, editing, annotating, and/or deleting.

2. The system of claim 1, wherein the first service interface comprises a web services schema, describing a web service interface to the first data source of the plurality of heterogeneous data sources, and the web services schema is used to automatically create a user interface for inputting data in fields determined from the web service schema.

3. The system of claim 1, wherein the address assigned to the first page component comprises a URL, and at least one page component of the plurality of page components can be dragged and dropped to a new display.

4. The system of claim 1, wherein the processor is further configured to provide the one or more roles to users that can be used to limit access to applications.

5. The system of claim 1, wherein the processor is further configured to convert at least one object from at least one data source of the plurality of heterogeneous data sources into at least one page component of the plurality of page components.

6. The system of claim 1, wherein the system allows for the construction of user interfaces to access different types of data.

7. The system of claim 1, wherein one or more page components of the plurality of page components contain interactive elements.

8. The system of claim 1, wherein the processor is further configured to control whether a page is displayed to a user based on the one or more roles and security.

9. The system of claim 1, wherein the processor is further configured to: receive edits to at least one page component of the plurality of page components or a page layout; and in response to receiving edits, store at least one updated page component or an updated page layout.

10. The system of claim 9, wherein the edits are received from a user; and the processor is further configured to: track changes to page components or page layout to allow users to make changes without administrative approval.

11. The system of claim 10, wherein the processor is further configured to version all page editing.

12. The system of claim 10, wherein the processor is further configured to version page layout.

13. The system of claim 10, wherein changes to page components or page layout are stored at a remote server.

14. The system of claim 13, wherein AJAX at a browser sends the version information to a remote server.

15. A method for constructing a web display comprising:
receiving, by one or more processors, a first page component and a second page component included in the web display;
obtaining, by the one or more processors, data from a plurality of heterogeneous data sources, the one or more processors performing:
locating a first interface description based on an address assigned to the first page component, the address having been created as unique to the first page component, and the first page component having been associated with one or more user-specific page component changes;
analyzing the first interface description and constructing a first service interface based on the analyzing the first interface description;
retrieving first data from a first data source of the plurality of heterogeneous data sources using the first service interface to access the first data; and
retrieving second data provided by a second data source of the plurality of heterogeneous data sources using a second service interface to access the second data, and wherein the first service interface is different from the second service interface; and
constructing, by the one or more processors, the web display, displaying the first data associated with the first page component and the second data associated with the second page component; and
controlling access of the first page component and/or the second page component based at least in part on one or more roles, the one or more roles corresponding to a set of one or more user privileges that allow a set of one or more actions, the set of one or more actions comprising one or more of reading, editing, annotating, and/or deleting.

16. The method of claim 15, the method further comprising:
receiving edits to at least one page component of the plurality of page components or a page layout; and
in response to receiving edits, storing at least one updated page component or an updated page layout.

17. The method of claim 16, wherein the edits are received from a user; and the method further comprising tracking changes to page components or page layout to allow users to make changes without administrative approval.

18. The method of claim 17, the method further comprising versioning all page editing.

19. The method of claim 17, the method further comprising versioning a page layout.

20. The method of claim 17, the method further comprising storing changes to page components or page layout at a remote server.

21. The method of claim 20, the method further comprising AJAX at a browser sending version update information to the remote server.

22. The method of claim 15, wherein one or more page components of the plurality of page components contain interactive elements.

23. The method of claim 15, the method further comprising controlling whether a page component is displayed to a user based on the one or more roles and security.

24. The method of claim 15, the method further comprising an XML editor framework automatically creating a user interface for inputting data in fields based on the web service schemas.

25. A non-transitory machine-readable storage medium storing one or more sequences of instructions, the instructions which when executed cause one or more processors to construct a web display at least in part by:
receiving a first page component and a second page component included in the web display;
obtaining data from a plurality of heterogeneous data sources at least in part by:
locating a first interface description based on an address assigned to the first page component, the address having been created as unique to the first page component, and the first page component having been associated with one or more user-specific page component changes;
analyzing the first interface description and constructing a first service interface based on the analyzing the first interface description;
retrieving first data from a first data source of the plurality of heterogeneous data sources using the first service interface to access the first data; and
retrieving second data provided by a second data source of the plurality of heterogeneous data sources using a second service interface to access the second data, and wherein the first service interface is different from the second service interface;
constructing the web display, displaying the first data associated with the first page component and the second data associated with the second page component; and
controlling access of the first page component and/or the second page component based at least in part on one or more roles, the one or more roles corresponding to a set of one or more user privileges that allow a set of one or more actions, the set of one or more actions comprising one or more of reading, editing, annotating, and/or deleting.

26. The non-transitory machine-readable storage medium of claim 25, the instructions further comprising instructions that cause the one or more processors to perform: versioning all page editing.

27. The non-transitory machine-readable storage medium of claim 25, the instructions further comprising instructions that cause the one or more processors to perform: controlling whether a page component is displayed to a user based on the one or more roles and security.

28. The non-transitory machine-readable storage medium of claim 25, further comprising instructions that cause an XML editor framework to automatically create a user interface for inputting data in fields based on the web service schemas.

29. The non-transitory machine-readable storage medium of claim 25, the instructions further comprising instructions that cause the one or more processors to perform:
receiving edits to at least one page component of the plurality of page components or a page layout; and
storing, in response to receiving edits, at least one updated page component or an updated page layout.

30. The non-transitory machine-readable storage medium of claim 29, wherein the edits are received from a user; and the instructions further comprising instructions that cause the one or more processors to perform: tracking changes to page components or page layout to allow users to make changes without administrative approval.

31. The non-transitory machine-readable storage medium of claim 30, wherein one or more page components of the plurality of page components contain interactive elements.

32. The non-transitory machine-readable storage medium of claim 30, the instructions further comprising instructions that cause the one or more processors to perform: versioning a page layout.

33. The non-transitory machine-readable storage medium of claim 30, further comprising instructions that cause the one or more processors to perform: storing one or more page components of the plurality of page components or the page layout at a remote server.

34. The non-transitory machine-readable storage medium of claim 33, the instructions further comprising instructions that cause AJAX at a browser to send version update information to the remote server.

* * * * *

UNITED STATES PATENT AND TRADEMARK OFFICE
CERTIFICATE OF CORRECTION

PATENT NO. : 8,819,542 B2  
APPLICATION NO. : 12/108190  
DATED : August 26, 2014  
INVENTOR(S) : Cudich et al.

Page 1 of 1

It is certified that error appears in the above-identified patent and that said Letters Patent is hereby corrected as shown below:

In the Drawings

On sheet 3 of 11, in figure 3, line 15, delete "caintains" and insert -- maintains --, therefor.

In the Specification

In column 1, line 42, delete "framework" and insert -- framework. --, therefor.

In column 5, line 28, delete "where" and insert -- were --, therefor.

In column 6, line 57, delete "include" and insert -- include: --, therefor.

Signed and Sealed this  
Tenth Day of March, 2015

Michelle K. Lee  
*Deputy Director of the United States Patent and Trademark Office*